United States Patent
Kobayashi et al.

(10) Patent No.: US 7,898,354 B2
(45) Date of Patent: Mar. 1, 2011

(54) PULSE GENERATION CIRCUIT AND MODULATOR

(75) Inventors: Shigeru Kobayashi, Tokyo (JP); Michiaki Matsuo, San Jose, CA (US); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 12/305,546

(22) PCT Filed: Jun. 20, 2007

(86) PCT No.: PCT/JP2007/062413
§ 371 (c)(1), (2), (4) Date: Dec. 18, 2008

(87) PCT Pub. No.: WO2008/001663
PCT Pub. Date: Jan. 3, 2008

(65) Prior Publication Data
US 2009/0174494 A1    Jul. 9, 2009

(30) Foreign Application Priority Data

Jun. 28, 2006  (JP) .................... 2006-178026
Dec. 20, 2006  (JP) .................... 2006-343269

(51) Int. Cl.
*H03K 7/02* (2006.01)
(52) U.S. Cl. ........................ 332/116; 332/115
(58) Field of Classification Search .......... 332/116, 332/115
See application file for complete search history.

(56) References Cited

U.S. PATENT DOCUMENTS

| 4,602,226 A | 7/1986 | Vatis |
| 6,292,067 B1 | 9/2001 | Sasabata et al. |
| 6,326,860 B1 * | 12/2001 | Kobayashi .................... 332/159 |
| 6,792,050 B1 | 9/2004 | Shiikuma et al. |
| 7,327,991 B2 * | 2/2008 | Ono et al. ..................... 455/112 |
| 2004/0132417 A1 | 7/2004 | Maeda et al. |
| 2006/0244538 A1 | 11/2006 | Yamashita |

FOREIGN PATENT DOCUMENTS

| JP | 55-045260 A | 3/1980 |
| JP | 61-274405 A | 12/1986 |
| JP | 63-10646 | 1/1988 |

(Continued)

OTHER PUBLICATIONS

Japanese Office Action dated Sep. 29, 2009.

(Continued)

*Primary Examiner* — Joseph Chang
(74) *Attorney, Agent, or Firm* — Pearne & Gordon LLP

(57) ABSTRACT

It is an object of the invention to provide a pulse generation circuit and a modulator for realizing a high On/Off ratio in a small circuit scale and with lower power consumption. A short pulse generation circuit according to the invention includes an oscillator 101, a control signal generation circuit 102, an intermittent frequency multiplier 103, a filter 104, and an output terminal 105. The oscillator 101 and the intermittent frequency multiplier 103 are active circuits implemented as active elements. A continuous signal is output from the oscillator 101 and is input to the intermittent frequency multiplier 103 and the intermittent frequency multiplier 103 intermittently operates according to a control signal output from the control signal generation circuit 102, thereby generating a short pulse signal, and a spurious component is removed through the filter.

2 Claims, 35 Drawing Sheets

FOREIGN PATENT DOCUMENTS

| | | |
|---|---|---|
| JP | 02-009201 A | 1/1990 |
| JP | 04-167645 A | 6/1992 |
| JP | 63-246061 A | 10/1998 |
| JP | 2000-049874 A | 2/2000 |
| JP | 2000-341347 A | 12/2000 |
| JP | 2001-177584 A | 6/2001 |
| JP | 2000-316028 A | 9/2001 |
| JP | 2002-101137 A | 4/2002 |
| JP | 2004-140480 A | 5/2004 |
| JP | 2004-354288 A | 12/2004 |
| JP | 2006-129212 A | 5/2006 |
| WO | 2005/091496 A1 | 9/2005 |

OTHER PUBLICATIONS

Japanese Office Action dated Jun. 16, 2009.
R.E. Forsythe, A Coherent Solid State, 225GHz Receiver, "Microwave journal, pp. 64-71 1982".
IEICE, ED2004-204, MW2004-211 (Jan. 2005).
International Search Report for PCT/JP2007/062413, Oct. 2007.

\* cited by examiner

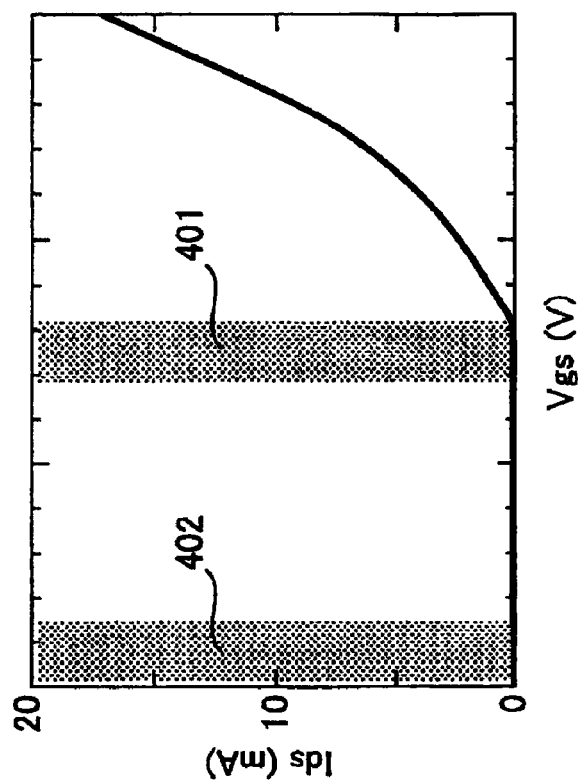
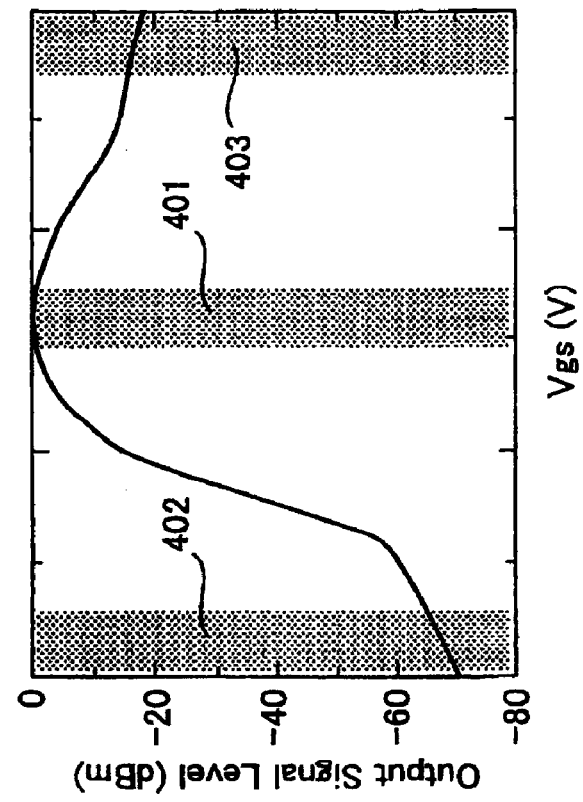
FIG. 4B
FIG. 4A

PULSE GENERATION CIRCUIT AND MODULATOR

TECHNICAL FIELD

This invention relates to a pulse generation circuit and a modulator, and in particular to a short pulse generation circuit using an intermittent frequency multiplier for intermittently operating a frequency multiplier and a short pulse generation circuit which operates with low power consumption and realizes a very high On/Off ratio.

BACKGROUND ART

Communications and radar using a short pulse signal are developed as one of UWB (Ultra Wide Band) technologies. To make a short pulse signal having only a component of any desired frequency band, there are a method of limiting the frequency band of a pulse signal through a filter and extracting only a specific frequency component, a method of intermittently operating an oscillator by a pulsed control signal, and a method of inputting a pulsed control signal to a mixer and curtaining a carrier signal, thereby generating a short pulse signal.

The performance required for the short pulse generation circuits includes low power consumption operation and a high On/Off ratio. The On/Off ratio refers to the mark-space ratio in amplitude modulation. The low power consumption operation becomes important performance whenever the circuit is installed in any machine. Thus, a high On/Off ratio is important performance for improving the communication quality in communications using a short pulse signal.

FIG. 28 shows the block configuration of a related art relating to a short pulse generation circuit using a mixer. FIG. 29 is a timing chart of signal waveforms in FIG. 28. The related art will be discussed with FIGS. 28 and 29.

A signal 2701 output from an oscillator 2601 is input to a mixer 2603. On the other hand, a control signal 2702 output from a control signal generation circuit 2602 is also input to the mixer. The signal 2701 is curtained by the control signal 2702 and is output as a short pulse signal 2703 from the mixer 2603. This circuit configuration is very simple and operates with low power consumption, but involves a problem of a low On/Off ratio because the signal from the oscillator 2601 leaks at the Off period.

As means for solving this problem, a configuration using a harmonic mixer 2802 as shown in FIG. 30 is proposed. The harmonic mixer is a mixer for outputting a signal having a frequency twice that of an input signal. FIG. 31 is a timing chart of signal waveforms in FIG. 30. The related art will be discussed with FIGS. 30 and 31.

A signal 2901 output from an oscillator 2801 is a signal having a half frequency component f0/2 of any desired frequency f0. The signal 2901 is input to the harmonic mixer 2802. On the other hand, a control signal 2902 output from a control signal generation circuit 2602 is also input to the harmonic mixer 2802.

The signal 2901 is curtained by the control signal 2902 and becomes a signal 2903 with the frequency at the On period being f0. The frequency of the signal 2903 at the Off period is f0/2 and the signal can be removed through a filter 2803 provided at the following stage of the harmonic mixer 2802, so that a short pulse signal having a higher On/Off ratio than that in the circuit configuration in FIG. 28 can be generated (refer to Non-patent document 1).

However, the circuit configuration of the related art described above involves a problem of the On/Off ratio depending on an APDP (Anti-Parallel Diode Pair) forming the harmonic mixer 2802 and being about 40 dB.

As means for solving this problem, a configuration wherein an intermittent amplifier is provided at the following stage of the harmonic mixer 2802 as shown in FIG. 32 is proposed. The intermittent amplifier is a circuit for controlling an amplification circuit by a control signal and intermittently operating the circuit. FIG. 33 is a timing chart of signal waveforms in FIG. 32. The related art will be discussed with FIGS. 32 and 33.

The operation from output of a signal 3101 from an oscillator 2801 to output of a signal 3103 from a harmonic mixer 2802 has been described above and therefore will not be discussed again.

The signal 3103 output from the harmonic mixer 2802 is input to an intermittent amplifier 3002. On the other hand, a control signal 3104 output from a control signal generation circuit 3001 is also input to the intermittent amplifier 3002, which then performs intermittent amplification operation.

If the timing of performing the intermittent amplification operation is when a short pulse signal is On in the signal 3103, the amplification at the On period is increased and the amplification at the Off period decreases because of isolation of the amplification circuit. Thus, the circuit configuration can be used to realize an On/Off ratio of about 60 dB (refer to Non-patent document 2).

However, the circuit configuration of the related art described above uses the amplification circuit to realize the On/Off ratio of about 60 dB and thus has a problem of an increase in power consumption. It also has a problem of circuit upsizing.

Aside from the circuit configuration using the harmonic mixer described above, a circuit configuration for improving the On/Off ratio by using a mixer and a frequency multiplier is also proposed. FIG. 34 shows the circuit configuration. FIG. 35 is a timing chart of signal waveforms in FIG. 34. The related art will be discussed with FIGS. 34 and 35.

A signal 3301 is output from an oscillator 2801 and is input to a modulation circuit 3201 made up of a mixer, etc. On the other hand, a control signal 3302 is output from a control signal generation circuit 2602 and is input to the modulation circuit 3201. The signal 3301 is curtained by the control signal 3302 and becomes a signal 3303. The signal 3303 is input to a frequency multiplier 3202 and becomes a signal 3304.

The conversion gain of the frequency multiplier changes with the level of an input signal; generally the higher the input signal level, the higher the conversion gain. Thus, if a short pulse signal having an amplitude difference like the signal 3303 is input, the conversion gain is high at the On period when the amplitude is high and the conversion gain becomes low at the Off period when the amplitude is low.

Thus, when the signal 3303 is input to the frequency multiplier and a frequency component is multiplied, the difference between the amplitude level at the On period and that at the Off period increases and the signal 3304 is generated. The main component of the signal at the Off period of the signal 3304 is a frequency component of a half the frequency of an output signal and thus is removed through a filter 3203 provided at the following stage, whereby an On/Off ratio of about 60 dB can be realized (refer to Patent document 1).

However, the circuit configuration of the related art described above involves a problem of distortion of the output signal waveform. The signal 3303 input to the frequency multiplier 3202 is a short pulse signal shaped like a burst and has a spread in a spectrum on the frequency axis.

On the other hand, the frequency multiplier is a circuit for distorting a signal to generate a double wave and thus when a signal having a spread in a spectrum is input to the frequency multiplier, intermodulation occurs and the output waveform is distorted. Since the spectrum further spreads because of the waveform distortion, high specification is required for the performance of the filter provided at the following stage and at the same time, it is difficult to control the waveform distortion; this is a problem.

Non-patent document 1: R. F. Forsythe, "A coherent solid sate, 225 GHz receiver," Microwave journal, pp. 64-71 1982

Non-patent document 2: IEICE, ED2004-204, MW2004-211 (2005-01)

Patent document 1: JP2004-354288A

DISCLOSURE OF THE INVENTION

Problems to be Solved by the Invention

The related arts described above are the circuit configurations difficult to satisfy the requirements of low power consumption operation and a high On/Off ratio at the same time. In the related art using the mixer (FIGS. 28 and 29), it is difficult to realize a high On/Off ratio. In the related art using the harmonic mixer (Non-patent document 1), it is also difficult to realize a sufficiently high On/Off ratio of about 60 dB. The related art using the harmonic mixer and the intermittent amplifier (Non-patent document 2) involves a problem in power consumption. The configuration using the modulation circuit and the frequency multiplier (Patent document 1) involves the problem of occurrence of intermodulation distortion.

The invention is intended for solving the problems in the related arts described above and it is an object of the invention to provide a pulse generation circuit and a modulator using an intermittent frequency multiplier intermittently operated with a frequency multiplier directly controlled by a control signal to suppress distortion of an output signal waveform and realize a high On/Off ratio in a small circuit scale and with lower power consumption.

Means For Solving the Problems

A pulse generation circuit of the invention is a pulse generation circuit for generating a pulse signal based on a first continuous signal output from an oscillator, and includes a control signal generation circuit for outputting a first control signal containing an On period and an Off period different from the On period in voltage value on a time axis; and an intermittent frequency multiplier for outputting a first multiplication signal resulting from multiplying the first continuous signal corresponding to the On period of the first control signal upon reception of input of the first control signal and the first continuous signal, wherein conversion gain in the On period of the first control signal is higher than conversion gain in the Off period in the intermittent frequency multiplier.

According to the configuration, the frequency multiplier is directly controlled by the control signal and is intermittently operated, whereby the pulse generation circuit for generating a pulse signal having a high On/Off ratio can be realized in a small circuit scale and with lower power consumption.

In the pulse generation circuit of the invention, the intermittent frequency multiplier has an active element, a control signal input terminal connected to one control terminal of the active element, to which the first control signal is input, and a first filter provided between the control signal input terminal and the control terminal of the active element, and a cutoff frequency of impedance of the first filter measured from the control signal input terminal is equal to the reciprocal or more of the duration of the On period of the first control signal.

In the pulse generation circuit of the invention, an amplitude of the first control signal output from the control signal generation circuit is larger than an amplitude of a continuous signal measured at the control terminal of the active element in the Off period of the first control signal.

According to the configuration, a pulse signal having a higher On/Off ratio can be realized.

The pulse generation circuit of the invention includes an amplifier for amplifying the first control signal, arranged between the control signal input terminal and the control terminal of the active element, wherein the first control signal having a larger amplitude than the first continuous signal is input to the active element in the Off period of the first control signal.

According to the configuration, the amplitude of the first control signal can be set small and power consumption of the control signal generation circuit can be decreased.

The pulse generation circuit of the invention further includes a second filter for allowing a frequency band component of an output signal of the intermittent frequency multiplier to pass therethrough and suppressing a signal power level of any other frequency band component.

According to the configuration, an unnecessary frequency component can be suppressed.

A pulse generation circuit of the invention is a pulse generation circuit for generating a pulse signal based on second and third continuous signals output from a differential oscillator, and includes a control signal generation circuit for outputting a first control signal containing an On period and an Off period which differs from the On period in voltage value on a time axis; a differential intermittent frequency multiplier for outputting second and third multiplication signals resulting from multiplying the second and third continuous signals, respectively, corresponding to the On period of the first control signal upon reception of input of the first control signal and the second and third continuous signals; and a waveform combining circuit for combining the second and third multiplication signals, wherein, the conversion gain in the On period of the first control signal is higher than the conversion gain in the Off period in the differential intermittent frequency multiplier.

According to the configuration, the differential frequency multiplier is directly controlled by the control signal and is intermittently operated, whereby the pulse generation circuit for generating a pulse signal having a high On/Off ratio can be realized in a small circuit scale and with lower power consumption. Particularly, the differential configuration is adopted, whereby a spurious component can be suppressed without a filter and a CN ratio can be increased.

In the pulse generation circuit of the invention, the differential intermittent frequency multiplier includes a first intermittent frequency multiplier for generating the second multiplication signal from the second continuous signal based on the first control signal; and a second intermittent frequency multiplier for generating the third multiplication signal from the third continuous signal based on the first control signal.

According to the configuration, the pulse generation circuit that can suppress an unnecessary frequency component without a filter using the intermittent frequency multiplier of single end without using an intermittent differential frequency multiplier can be easily configured.

The pulse generation circuit of the invention further includes a phase shifter for performing a phase shift of at least either of the second and third multiplication signals supplied from the intermittent frequency multiplier and supplying the phase-shifted signal to the waveform combining circuit.

According to the configuration, phase control can be performed with high accuracy.

In the pulse generation circuit of the invention, the control signal generation circuit further outputs a second control signal containing an On period and an Off period which differs from the On period in voltage value on the time axis, the oscillator outputs the first continuous signal with the signal power level intermittently changed based on the second control signal, and the first continuous signal has a signal level in the On period of the second control signal higher than a signal level in the Off period, and the On period of the second control signal contains the On period of the first control signal.

According to the configuration, a pulse signal having a higher On/Off ratio can be realized with lower power consumption.

In the pulse generation circuit of the invention, the intermittent frequency multiplier includes a matching circuit provided between the oscillator and the active element, the control signal generation circuit further outputs a third control signal containing an On period and an Off period which differs from the On period in voltage value on the time axis, and the matching circuit controls impedance corresponding to the Off period of the third control signal upon reception of input of the third control signal.

According to the configuration, the amplitude of the first control signal can be set small and power consumption of the control signal generation circuit can be decreased.

A modulator of the invention is a modulator including any pulse generation circuit of the invention, wherein the control signal generation circuit includes a data signal generation circuit for outputting a data signal and a modulation circuit for generating a modulation signal corresponding to the data signal, the modulator for outputting the modulation signal containing an On period and an Off period.

According to the configuration, the modulator having high SN can be realized as lower power consumption operation by using a pulse signal having a high On/Off ratio.

The modulator of the invention includes a code string detection circuit for detecting a code string of the data signal supplied from the data signal generation circuit and outputting a code signal corresponding to a predetermined code string and a signal level control circuit for adjusting the amplitude value of a continuous signal supplied from the oscillator in response to the code signal and supplying the continuous signal whose amplitude value has been adjusted to the intermittent frequency multiplier.

According to the configuration, if the pulse width of a transmission signal is short and ultra high speed communications are required, the inclination in the transient state of a modulation signal can be made constant independently of the code string.

In the modulator of the invention, the intermittent frequency multiplier is an active circuit in which the conversion gain relative to an input continuous signal is controlled by a bias value, and the modulator includes a bias value control circuit for controlling the bias value of the active element contained in the active circuit in response to the code signal output from the code string detection circuit.

According to the configuration, if the pulse width of a transmission signal is short and ultra high speed communications are required, the inclination in the transient state of a modulation signal and the amplitude value in the stationary state can be made constant independently of the code string.

ADVANTAGES OF THE INVENTION

According to the invention, the pulse generation circuit having the oscillator, the control signal generation circuit, the intermittent frequency multiplier, and the filter can be realized as low power consumption operation, wherein the intermittent frequency multiplier is intermittently operated by the first control signal output from the control signal generation circuit for changing the conversion gain in the On period of the control signal and the conversion gain in the Off period and changing the frequencies of the main components in the On period and the Off period, thereby suppressing distortion of the output signal and generating a pulse signal having a high On/Off ratio.

BRIEF DESCRIPTION OF THE DRAWINGS

FIG. 4 is a drawing to show the characteristic of the relationship between control signal voltage value and output signal level in the first embodiment of the invention.

DESCRIPTION OF REFERENCE NUMERALS

Figure 1:
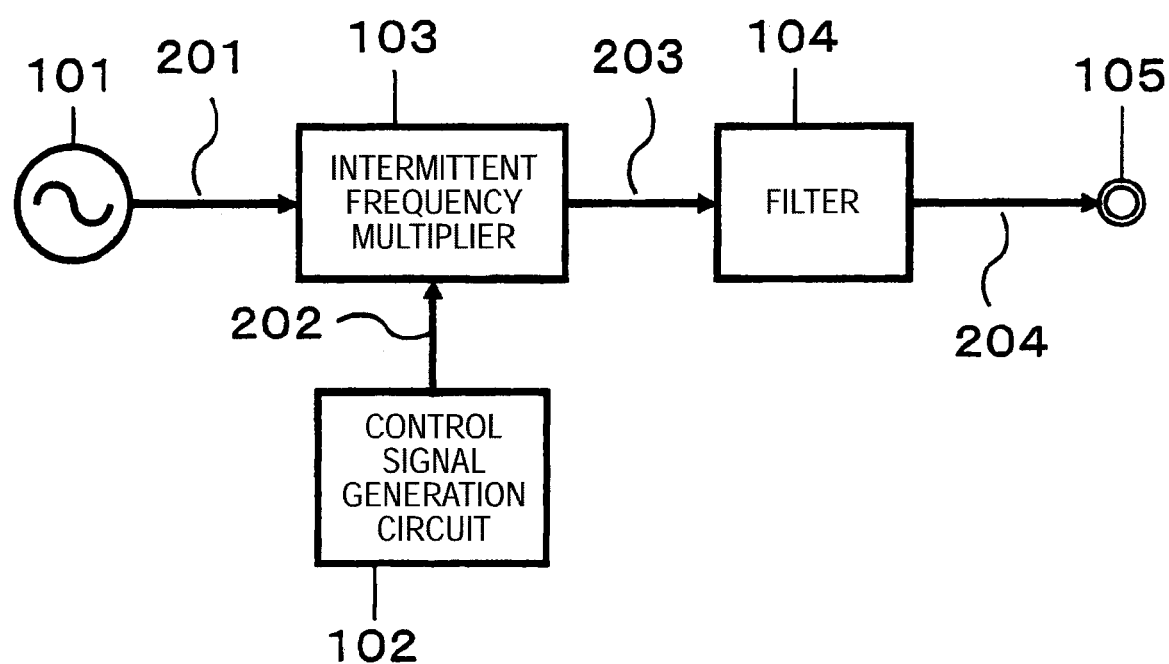
FIG. 1 is a drawing to show the circuit configuration of a short pulse generation circuit in a first embodiment of the invention.

101 Oscillator
102 Control signal generation circuit
103 Intermittent frequency multiplier
104 Filter
105 Output terminal
201-204 Signal waveform
301 Active element
302 Matching circuit
303 Matching circuit
304 Coupler
305 Coupler
306 Filter
307 DC feeder
308 Power supply
309 Bypass capacitor
310 Control signal input terminal
311 Amplifier
401-403 Control region
501-503 Characteristic curve
601 Current source
602 Resistor
603 Power supply
701 Filter
702 DC feeder
703 Power supply
801 Current source
901 Intermittent oscillator
902 Intermittent differential frequency multiplier
903 Waveform combining circuit
1001-1006 Signal waveform
1101, 1102 Phase shifter
1301 Intermittent oscillator
1302 Control signal generation circuit
1401-1405 Signal waveform
1501 Signal level control circuit
1502 Code string detection circuit
1503 Modulation circuit
1504 Data signal generation circuit
1601-1607 Signal waveform
1701 Bias value control circuit
1801-1804 Signal waveform
1901, 1902 Output signal waveform
2001, 2002 Output signal waveform
2101, 2102 Characteristic curve
2301-2305 Signal waveform
2401, 2403 Control signal waveform
2402, 2404 Output signal waveform
2501, 2503 Control signal waveform
2502, 2504 Output signal waveform
2601 Oscillator
2602 Control signal generation circuit
2603 Mixer
2604 Output terminal
2701-2703 Signal waveform
2801 Oscillator
2802 Harmonic mixer
2803 Filter
2901-2904 Signal waveform
3001 Control signal generation circuit
3002 Intermittent amplifier
3101-3106 Signal waveform
3201 Modulation circuit
3202 Frequency multiplier
3203 Band pass filter
3301-3305 Signal waveform
3401 Control signal generation circuit
3402, 3403 Matching circuit
3404 Control signal input terminal
3405 Control signal input terminal
3501 Control signal waveform
3502 Control signal waveform

BEST MODE FOR CARRYING OUT THE INVENTION

Embodiments of the invention will be discussed below with reference to the accompanying drawings.

First Embodiment

FIG. 1 is a block diagram of a short pulse generation circuit in a first embodiment of the invention. The short pulse generation circuit shown in FIG. 1 includes an oscillator 101, a control signal generation circuit 102, an intermittent frequency multiplier 103, a filter 104, and an output terminal 105. The intermittent frequency multiplier is a circuit for directly controlling a frequency multiplier by a control signal and intermittently operating the circuit. The oscillator 101 and the intermittent frequency multiplier 103 are active circuits implemented as active elements.

In the description to follow, it is assumed that the active element is an FET (Field-Effect Transistor). Although the multiple number of the intermittent frequency multiplier is n (n: Positive integer), in the description to follow, it is assumed that the desired frequency of an output signal is f0, that the frequency of an output signal of the oscillator is f0/2, and that the intermittent frequency multiplier is a doubler circuit. The signal waveform of a control signal output from the control signal generation circuit 102 is arbitrary; in the description to follow, it is assumed that the signal waveform is a pulse waveform.

The oscillator 101 outputs a continuous signal to the intermittent frequency multiplier 103. The intermittent frequency multiplier 103 intermittently operates according to a control signal output from the control signal generation circuit 102, thereby generating a short pulse signal. The filter 104 removes the spurious component of the short pulse signal.

Figure 2:
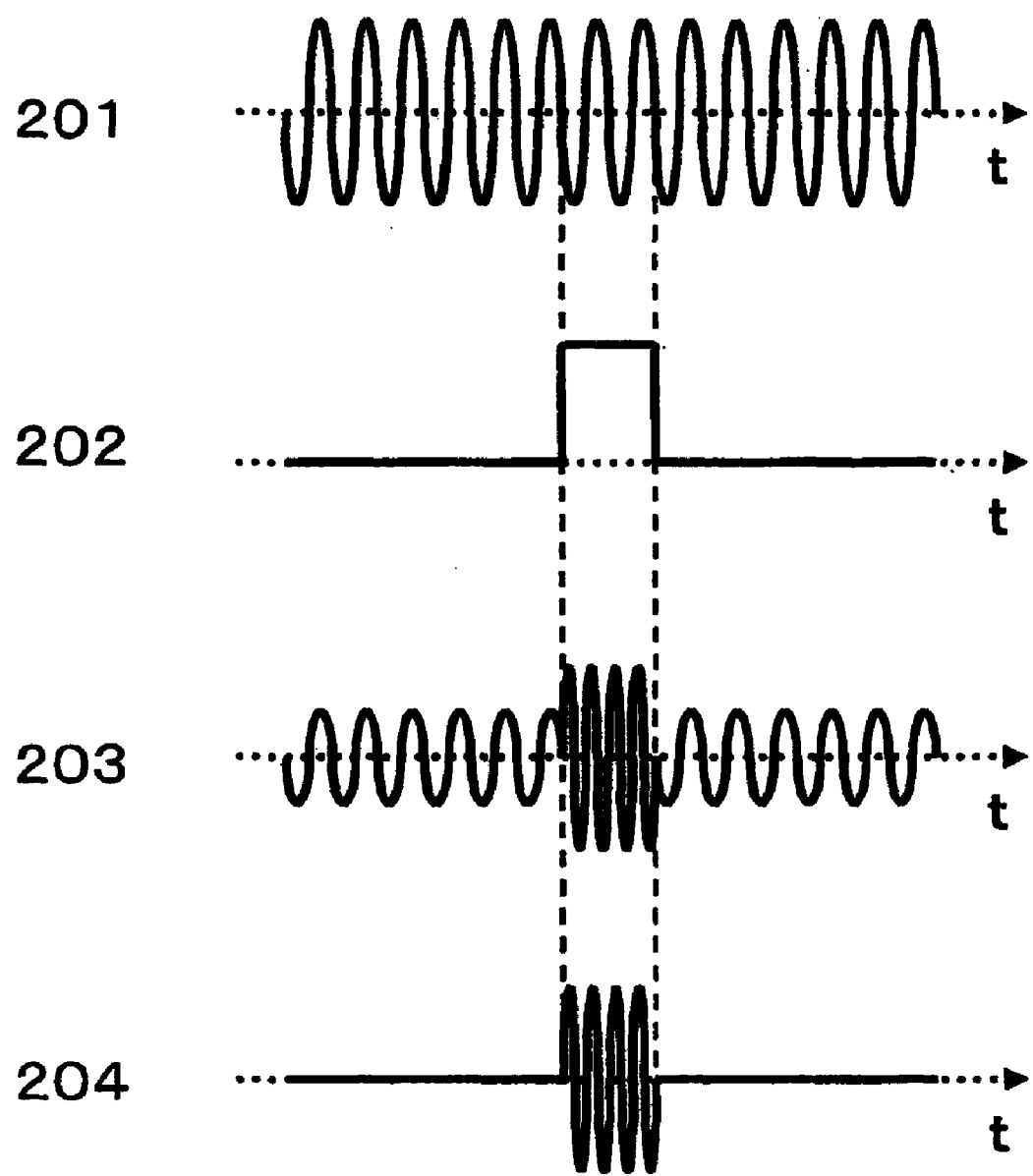
FIG. 2 is a drawing to show the characteristics of signal waveforms in the first embodiment of the invention.

FIG. 2 is a timing chart of signals and a control signal in the block diagram of FIG. 1. Each vertical axis indicates voltage axis and each horizontal axis indicates the time axis. The operation of the short pulse generation circuit for generating a short pulse signal having a high On/Off ratio (ratio between the amplitude level at the On period and that at the Off period) with low power consumption in the first embodiment will be discussed with FIGS. 1 and 2.

The oscillator 101 outputs a continuous signal 201 to the intermittent frequency multiplier 103.

The control signal generation circuit 102 outputs a control signal 202 to the intermittent frequency multiplier 103. The control signal 202 acts on an active element forming a part of the intermittent frequency multiplier 103.

The operation point of FET forming a part of the intermittent frequency multiplier 103 is controlled based on the voltage value of the control signal 202.

The FET operation point is controlled, whereby the conversion gain in a period where the voltage value of the control signal 202 is high (hereinafter, On period) can be made high and the conversion gain in a period where the voltage value is low (hereinafter, Off period) can be made low.

Thus, the main frequency component in the Off period in a signal 203 is frequency f0/2 and the amplitude value of the component of the frequency f0 output from the intermittent frequency multiplier 103 in the On period differs largely from that in the Off period and the difference between the amplitude values in the On period and the Off period is the On/Off ratio (units:dB). Setting of the voltage values in the On period and the Off period of the control signal 202 is described later in detail; it is desirable that the voltage values should be set so that the maximum conversion gain is provided in the On period.

The signal 203 output from the intermittent frequency multiplier 103 is input to the filter 104. The filter 104 is a spurious suppression filter for allowing a signal of a frequency f0 band to pass through and suppressing other frequency band components; for example, it is a BPF (band pass filter) or a BEF (band elimination filter).

It is desirable that the band of the filter 104 should be provided as a band twice or more the reciprocal of the pulse width in the On period of the signal 203, whereby waveform rounding when a signal 204 is output from the filter 204 can be prevented.

The filter 104 allows a signal of a frequency f0 band of the signal 203 to pass through the filter 104 and suppresses a signal of a frequency f0/2 band of the signal 203. Accordingly, the output terminal 105 can output a short pulse signal 204 with a high On/Off ratio having a frequency component of the frequency f0 band. The circuit configuration of the oscillator 101 is a known technology and therefore will not be discussed again.

Figure 3:
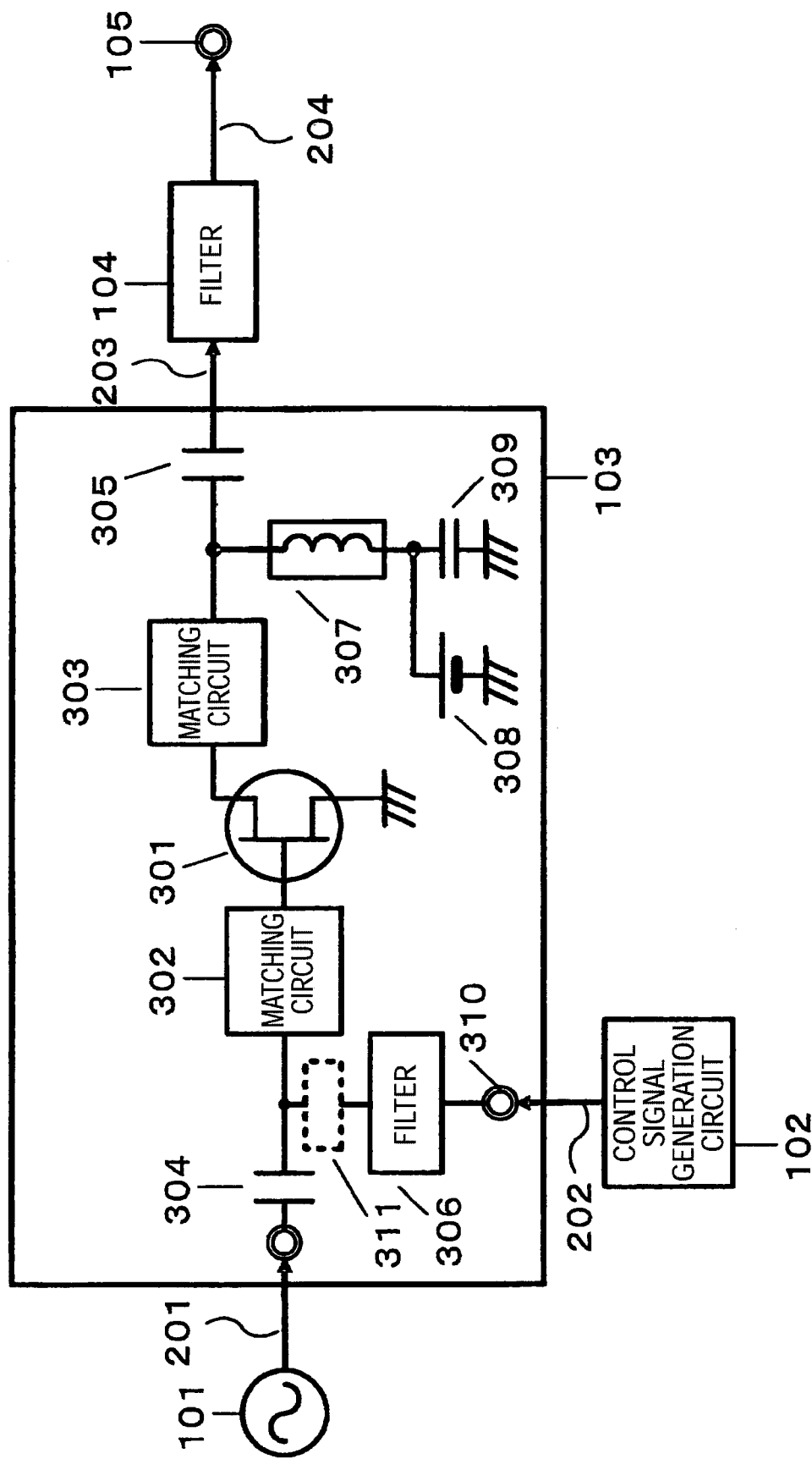
FIG. 3 is a drawing to show one example of the circuit configuration of an intermittent frequency multiplier in the first embodiment of the invention.

FIG. 3 shows one example of the intermittent frequency multiplier 103. The intermittent frequency multiplier 103 shown in FIG. 3 includes an active element 301, a matching circuit 302, a matching circuit 303, a coupler 304, a coupler 305, a filter 306, a DC feeder 307, a power supply 308, a bypass capacitor 309, and a control signal input terminal 310.

A control method of an operation point is a method of directly controlling a gate-source voltage (Vgs) by the control signal 202. The control signal 202 is output from the control signal generation circuit 102 and is combined with the continuous signal 201. The continuous signal 201 output from the oscillator 101 is input from a gate terminal of the active element 301. The coupler 304 and the coupler 305 are used for cutting DC and are each made up of a capacitor element and a parallel coupling line.

A high frequency signal passing through the coupler 304 is the continuous signal 201 output from the oscillator 101 and the spectrum waveform does not have a spread (but has phase noise) and thus the pass band of the coupler 304 need not be a wide band.

On the other hand, a high frequency signal passing through the coupler 305 is a short pulse signal shaped like a burst. Since the spectrum waveform of the short pulse signal has a wide band, the pass band of the coupler 305 needs to be a wide band. It is desirable that the band should be twice or more the reciprocal of the pulse width of the short pulse signal. The matching circuit 302 is an input side matching circuit for allowing a frequency f0/2 band signal to pass through, and the matching circuit 303 is an output side matching circuit for allowing a frequency f0 band signal to pass through. The design of the matching circuits is a known technology and therefore will not be discussed again.

The filter 306 is a filter which becomes open at the frequency f0/2 or becomes the proximity thereof on a Smith chart when the impedance of the filter 306 is measured from the transmission line connecting the matching circuit 302 and the coupler 304. It is made up of an electricity length $\lambda g/4$ open stub and an electricity length $\lambda g/4$ line at the frequency f0/2 in a distributed constant line and is made up of a capacitance element and a dielectric element self resonating at the frequency f0/2 in a concentrated constant element.

The frequency characteristic of input impedance when the filter 306 is measured from the control signal input terminal 310 becomes an LPF (Low-Pass Filter) in a low frequency band from DC because of the effect of the frequency characteristic of the filter 306. It is desirable that the cutoff frequency of the LPF in this case should be equal to the reciprocal or more of the pulse width of the control signal 202.

If the cutoff frequency is lower than the reciprocal of the pulse width of the control signal 202, the waveform of the control signal 202 rounds and the high speed property of Vgs control is impaired and the rising edge and the falling edge of an output signal 204 do not become steep. As the rising edge and the falling edge of the output signal 204 do not become steep, the pulse width becomes narrow and the spectrum waveform spreads. The spread of the spectrum waveform can become a spurious component for a frequency band outside the channel band allocated in communications, for example.

If the sum total of the rising time and the falling time becomes the pulse width or more because of the waveform rounding, the amplitude value of the output signal 204 falls, resulting in SN degradation in a reception system. The cutoff frequency can be set according to the line length, the line width, and stub in circuit design.

It is desirable that the filter 306 should be open also at the frequency f0/2 or the proximity of open on a Smith chart when the impedance of the filter 306 is measured from the transmission line connecting the matching circuit 302 and the coupler 304.

Accordingly, wraparound of a signal of frequency f0 existing on the circuit to the power supply side can be prevented, contributing to stabilization of the circuit.

The DC feeder 307 is open at least at the frequencies f0 and f0/2 when the impedance of the DC feeder 307 is measured from the transmission line connecting the matching circuit 303 and the coupler 305; ideally the DC feeder 307 allows only a DC component to pass through.

For example, it is made up of an electricity length $\lambda g/4$ open stub and an electricity length $\lambda g/4$ line in a distributed constant line and is made up of a capacitance element and a dielectric element self resonating at the corresponding frequency in a concentrated constant element. It is desirable that the bypass capacitor 309 should be installed on the side of the power supply 308 to prevent parasitic oscillation.

On the other hand, no bypass capacitor is provided at the control signal input terminal 310. If a bypass capacitor is provided at the control signal input terminal 310, the time constant grows combined with a resistance component and a capacitance component existing in the line and the circuit, and the waveform of the control signal 202 rounds. As the waveform rounds, a problem of making dull the rising edge and the falling edge of the output waveform 204 occurs as described above.

In FIG. 4, (a) is a drawing to show a characteristic curve of Vgs and output signal level (frequency f0) in the circuit configuration in FIG. 3. The characteristic curve is normalized with the maximum value of the output signal level. The drain-source voltage (hereinafter, Vds) at this time is Vds1.

In (a) of FIG. 4, the output signal level difference between a region 401 and a region 402 is about 70 dB and it is desirable that the voltage value of the control signal 202 in the On period should be set to Vgs in the region 401 and that the voltage value of the control signal 202 in the Off period should be set to Vgs in the region 402; a short pulse signal with On/Off ratio 70 dB of an output signal can be generated. The horizontal axis in (a) of FIG. 4 is 0.1 V/div and in setting of the voltage values in the On period and the Off period of the control signal 202, the numeric values can be realized easily if a usually used driver is used.

In FIG. 4, (b) is a drawing to show a characteristic curve of Vgs and Id. Areas 401 and 402 in (b) of FIG. 4 correspond to those in (a) of FIG. 4. Thus, Vgs in the region 401, namely, Vgs at which the maximum conversion gain is provided is a pinch off voltage or a voltage value in the proximity thereof, and a drain current (Id) flowing through the circuit becomes a very small value. Since the voltage value of the control signal 202 in the Off period is set to Vgs in the region 402, no current flows in the Off period. Thus, the circuit has the advantages that it operates with low power consumption and that the circuit is hard to parasitically oscillate.

At this time, setting is made so that the amplitude of the control signal 202 becomes larger than the amplitude of a continuous signal measured at the gate terminal of the active element 301 in the operation in the Off period in the region 402. To realize a high On/Off ratio, it is important to suppress occurrence of a harmonic in the Off period. The purpose of stipulating the amplitude of the control signal 202 as described above is that a harmonic occurs as the maximum potential of the amplitude of the continuous signal measured at the gate terminal becomes the pinch off voltage or more.

If an amplifier 311 (indicated by the dotted line in FIG. 3) for amplifying the amplitude of the control signal 202 is inserted between the control signal input terminal 310 and the gate terminal of the active element 311, setting may be made so that the amplified amplitude of the control signal 202 becomes larger than the amplitude of a continuous signal measured at the gate terminal of the active element 301, and the amplitude of the control signal 202 need not necessarily be larger than the amplitude of the continuous signal measured at the gate terminal of the active element 301. In so doing, the advantage that the power consumption of a base-band circuit for generating the control signal 202 can be decreased is provided.

By the way, the voltage value of the control signal 202 in the Off period can also be positioned in a region 403 shown in (a) of FIG. 4, but it is obvious that a high On/Off ratio cannot be ensured and further since Id is large, the power consumption increases and the circuit becomes easy to parasitically oscillate.

In this instance, on the rising part of the control signal, a current also flows in the Off period and thus terminal-to-terminal capacitance of the FET and stray capacitance existing in the circuit can be previously charged, leading to the high speed property of the intermittent operation; however, it is desirable that the voltage value of the control signal 202 in the Off period should be set in the region 402 for a high On/Off ratio, lower power consumption operation, and the stability of the circuit.

Figure 5:
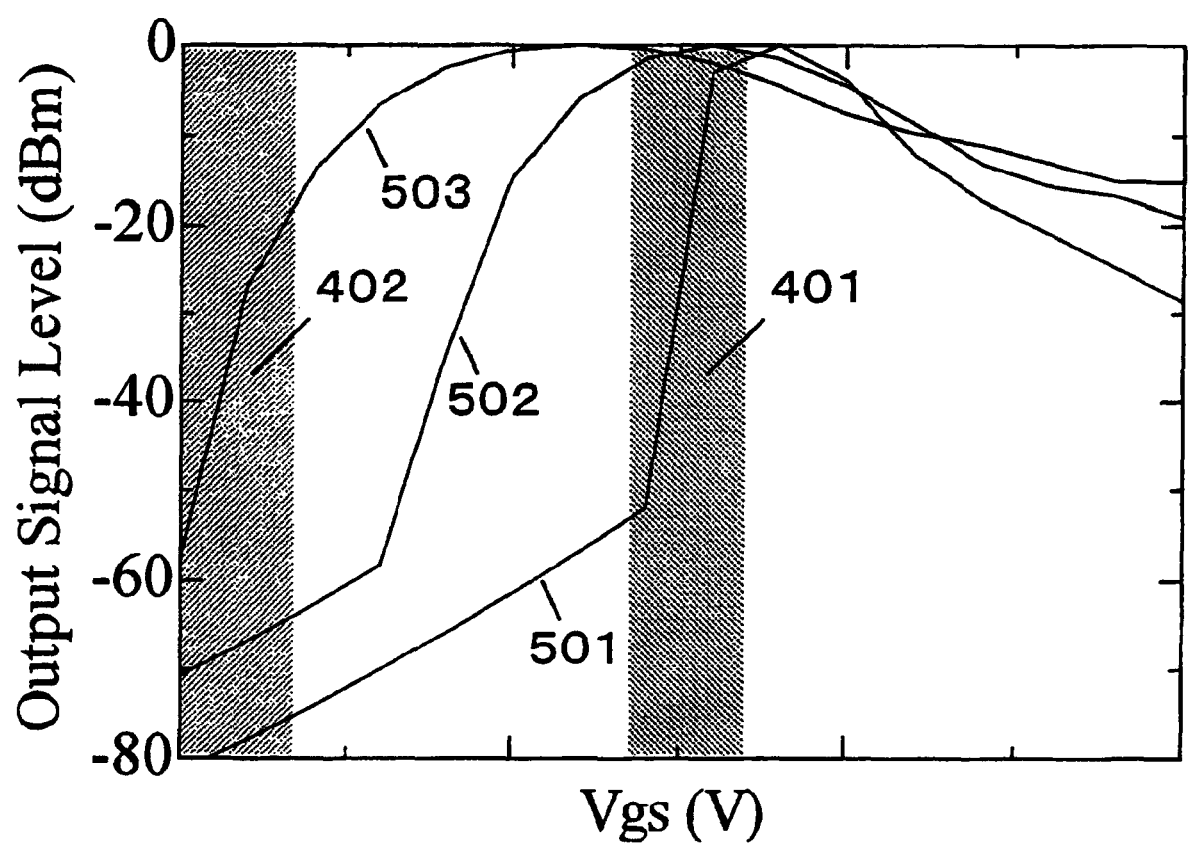
FIG. 5 is a drawing to show the characteristic of the relationship between control signal voltage value and output signal level in the first embodiment of the invention.

FIG. 5 is a drawing to show characteristic curves of Vgs and output signal level (frequency f0) in the circuit configuration in FIG. 3 by comparison for each input signal level. The vertical axis of each characteristic curve is normalized with the maximum value for each output signal level. The input signal level becomes larger in the order of characteristic curves 501, 502, and 503.

From FIG. 5, to set the voltage value of the control signal 202 in the On period to Vgs in the region 401 and the voltage value of the control signal 202 in the Off period to Vgs in the region 402, if the input signal level is larger, change start of the output signal level relative to Vgs change is earlier.

In other words, for change in the voltage value (Vgs) of the control signal 202, if the input signal level is larger, the output signal 204 rises and falls more rapidly and it is desirable that the input signal level should be larger for a high speed property of the intermittent operation. However, if the input signal level is smaller, the On/Off ratio is higher. In this way, it is desirable that the input signal level to the intermittent frequency multiplier 103 should be designed conforming to the system specification.

As described above, the conversion gain of the intermittent frequency multiplier 103 in the On period of the control signal and the conversion gain in the Off period are controllable and the frequency of the main component in the On period and the Off period is controllable using the oscillator 101, the control signal generation circuit 102, the intermittent frequency multiplier 103, the filter 104, and the output terminal 105, whereby the short pulse generation circuit for generating a short pulse signal having a high On/Off ratio can be realized with low power consumption.

The method of directly controlling Vgs by the control signal 202 has been described as the control method of the intermittent frequency multiplier 103, but a method of controlling a current by a control signal and controlling the value of voltage applied to a resistor as the current flows may be adopted.

Figure 6:
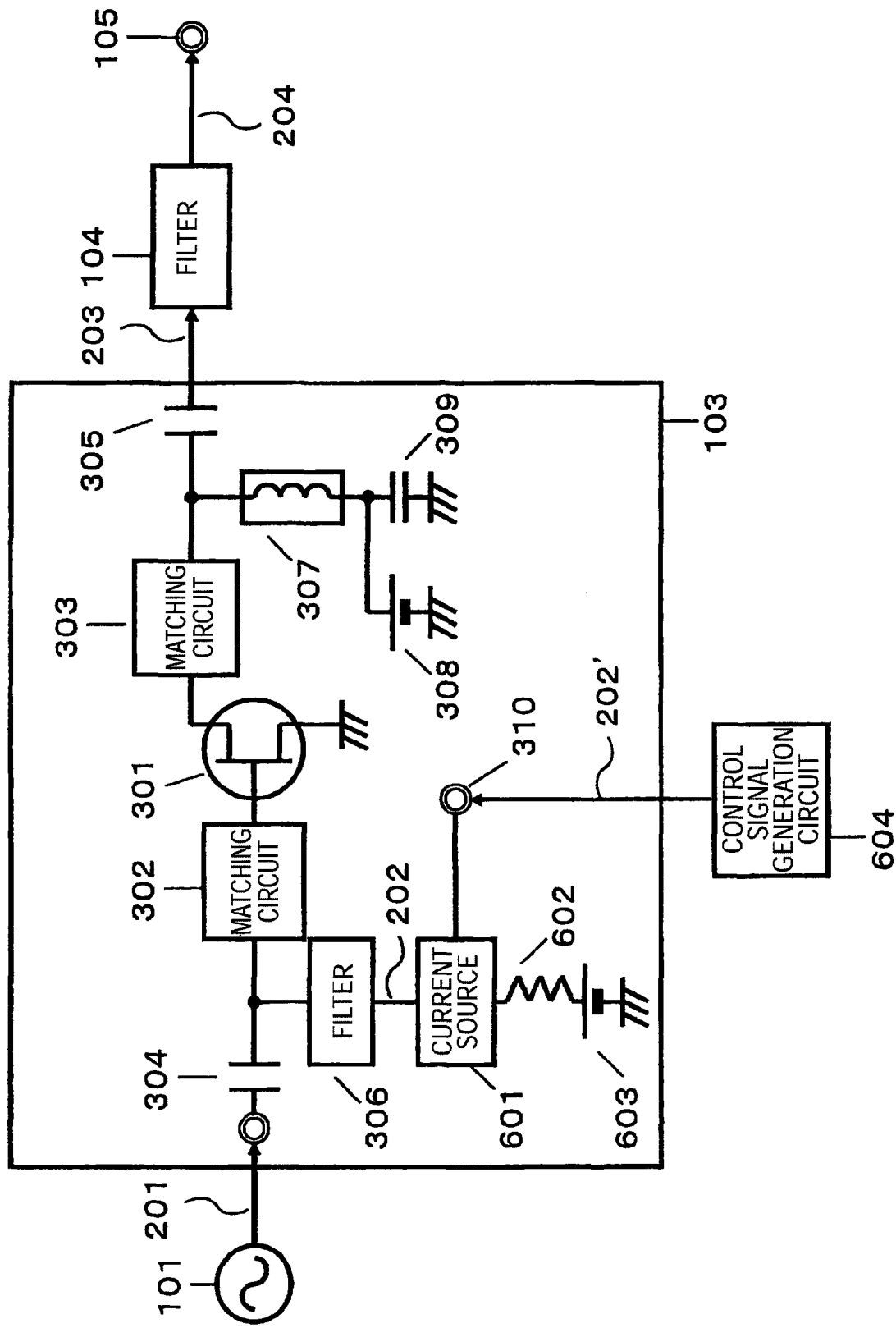
FIG. 6 is a drawing to show one example of the circuit configuration of the intermittent frequency multiplier in the first embodiment of the invention.

FIG. 6 shows another example of the intermittent frequency multiplier 103. The circuit configuration differs from the circuit shown in FIG. 3 in that a current source 601, a resistance element 602, a power supply 603, and a control signal generation circuit 604 are provided and that a control signal 202' is output from the control signal generation circuit 604. Like the control signal 202, the control signal 202' has an On period and an Off period. The current source 601 is controlled by the control signal 202', whereby a current intermittently flows through the resistance element 602 and a voltage is applied in accordance with the On period and the Off period of the control signal 202'.

The value of the voltage applied to the resistance element 602 changes in accordance with the On period and the Off period of the control signal 202'. The control signal 202 is generated based on the value of the voltage applied to the resistance element 602 and the power supply 603. As previously described with FIG. 3, Vgs of the active element 103 is controlled by the control signal 202 and Vgs in the On period is set in the region 401 in FIG. 4 and Vgs in the Off period is set in the region 402, whereby the short pulse generation circuit for suppressing distortion of the output signal and generating a short pulse signal having a high On/Off ratio as described above can be realized. The circuit configuration is similar to that in FIG. 3 except for the control method of Vgs and therefore the operation will not be discussed again.

Figure 7:
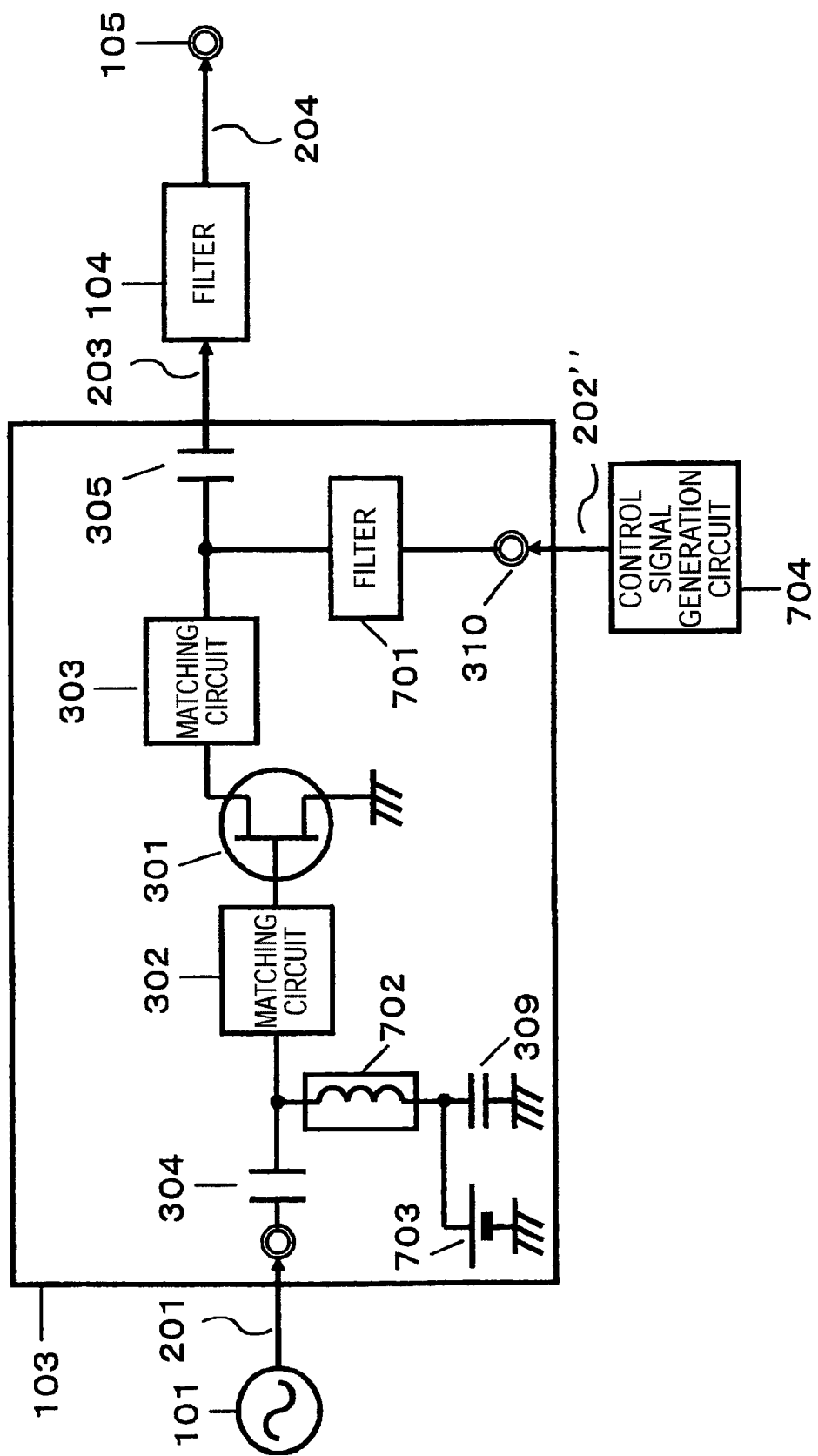
FIG. 7 is a drawing to show one example of the circuit configuration of the intermittent frequency multiplier in the first embodiment of the invention.

A method of directly controlling Vds by the control signal may be adopted. FIG. 7 shows another example of the intermittent frequency multiplier 103. The circuit configuration differs from that in FIG. 3 in that a filter 701, a DC feeder 702, a power supply 703, and a control signal generation circuit 704 are provided without providing the filter 306, the DC feeder 307, or the power supply 308 and that a control signal 202" is output from the control signal generation circuit 704. Like the control signal 202, the control signal 202" has an On period and an Off period and the pulse width is equal.

The filter 701 is a filter whose impedance is open on the Smith-chart at the frequency f0 or the proximity thereof chart when the impedance of the filter 701 is measured from the transmission line connecting the matching circuit 303 and the coupler 305 in FIG. 7. The filter 701 is made up of an open stub whose electricity length is λg/4 and a line whose electricity length is λg/4 at the frequency f0 in a distributed constant line and is made up of a capacitance element and a dielectric element self resonating at the frequency f0 in a concentrated constant element.

The frequency characteristic of input impedance when the filter 701 is measured from the control signal input terminal 310 becomes an LPF in a low frequency band from DC because of the effect of the frequency characteristic of the filter 701. It is desirable that the cutoff frequency of the LPF at the time should be the reciprocal of the pulse width of the control signal 202" or more. The reason is described above and therefore will not be discussed again.

It is desirable that the filter 701 should be open also at the frequency f0/2 or should be the proximity thereof on a Smith chart when the impedance of the filter 701 is measured from the transmission line connecting the matching circuit 303 and the coupler 305. The reason is described above and therefore will not be discussed again.

The impedance of the DC feeder 702 which is measured from the transmission line connecting the matching circuit 302 and the coupler 304 is open on the Smith-chart at least at the frequency f0/2; ideally the DC feeder 702 allows only a DC component to pass through. For example, the DC feeder 702 is made up of an open stub whose electricity length is λg/4 and a line whose electricity length is λg/4 in a distributed constant line at the frequency f0/2 and is made up of a capacitance element and a dielectric element self resonating at the frequency f0/2 in a concentrated constant element.

It is desirable that the impedance of the DC feeder 702 which is measured from the transmission line connecting the matching circuit 302 and the coupler 304 is open on the Smith-chart at the frequency f0. The reason is described above and therefore will not be discussed again. The bypass capacitor 309 is installed on the side of the power supply 703 to prevent parasitic oscillation. On the other hand, no bypass capacitor is provided at the control signal input terminal 310. The reason is described above and therefore will not be discussed again.

Vgs is made constant in the region 401 in FIG. 4 and Vds in the On period of the control signal 202" is set to Vds1, whereby the conversion gain of the intermittent frequency multiplier 103 in the On period can be maximized.

On the other hand, Vds in the Off period of the control signal 202 is set to Vds2. Vds2 is a smaller value than Vds1 and at this time, Id is zero. The operation points are thus set, so that the conversion gain in the On period of the control signal 202" can be made high and the conversion gain in the Off period can be made low, whereby the short pulse generation circuit for generating a short pulse signal having a high On/Off ratio can be realized with low power consumption.

Figure 8:
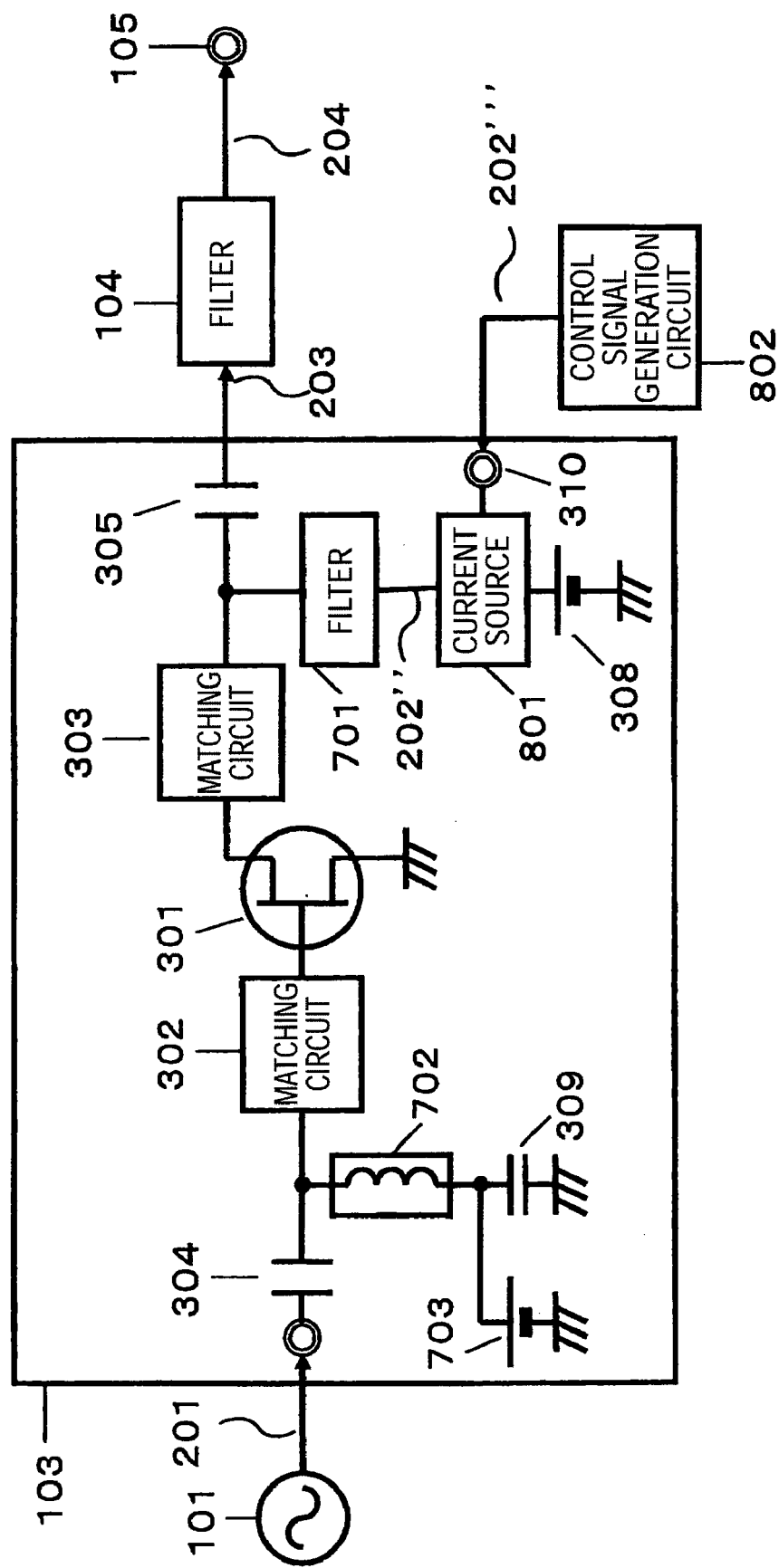
FIG. 8 is a drawing to show one example of the circuit configuration of the intermittent frequency multiplier in the first embodiment of the invention.

A method of controlling Id by the control signal may be adopted. FIG. 8 shows another example of the intermittent frequency multiplier 103. The circuit configuration differs from that in FIG. 7 in that a power supply 308, a current source 801, and a control signal generation circuit 802 are provided and that a control signal 202''' is output from the control signal generation circuit 802.

The current source 801 is controlled by the control signal 202''', whereby Vds in the On period of the control signal 202''' is set to Vds1 and Vds in the Off period is set to Vds2 and the intermittent frequency multiplier is operated intermittently. The circuit configuration is similar to that in FIG. 7 except for the control method of Vds and therefore the operation will not be discussed again.

In the description given above, the oscillation frequency of the oscillator 101 is a half the frequency of the output signal and the intermittent frequency multiplier 103 is a doubler circuit; however, the oscillation frequency of the oscillator 101 may be 1/n of the frequency of the output signal and the intermittent frequency multiplier 103 may be a multiplying-by-n circuit where n is a positive integer.

To describe the examples of the intermittent frequency multiplier 103 with FIGS. 3 and 6 to 8, the filters 306 and 701 and the DC feeders 307 and 702 are inserted between the coupler 304 and the matching circuit 302 in the circuit configuration, but may be inserted between the matching circuit 302 and the active element 301 in the circuit configuration.

The matching circuits 302 and 303 are provided, but may be omitted if the input/output impedance of the intermittent frequency multiplier 103 ensures any desired characteristic as described above according to the input/output impedance of the active element 301 and the impedance of the peripheral circuitry of the filter 306, the DC feeder 307, etc.

Second Embodiment

Figure 9:
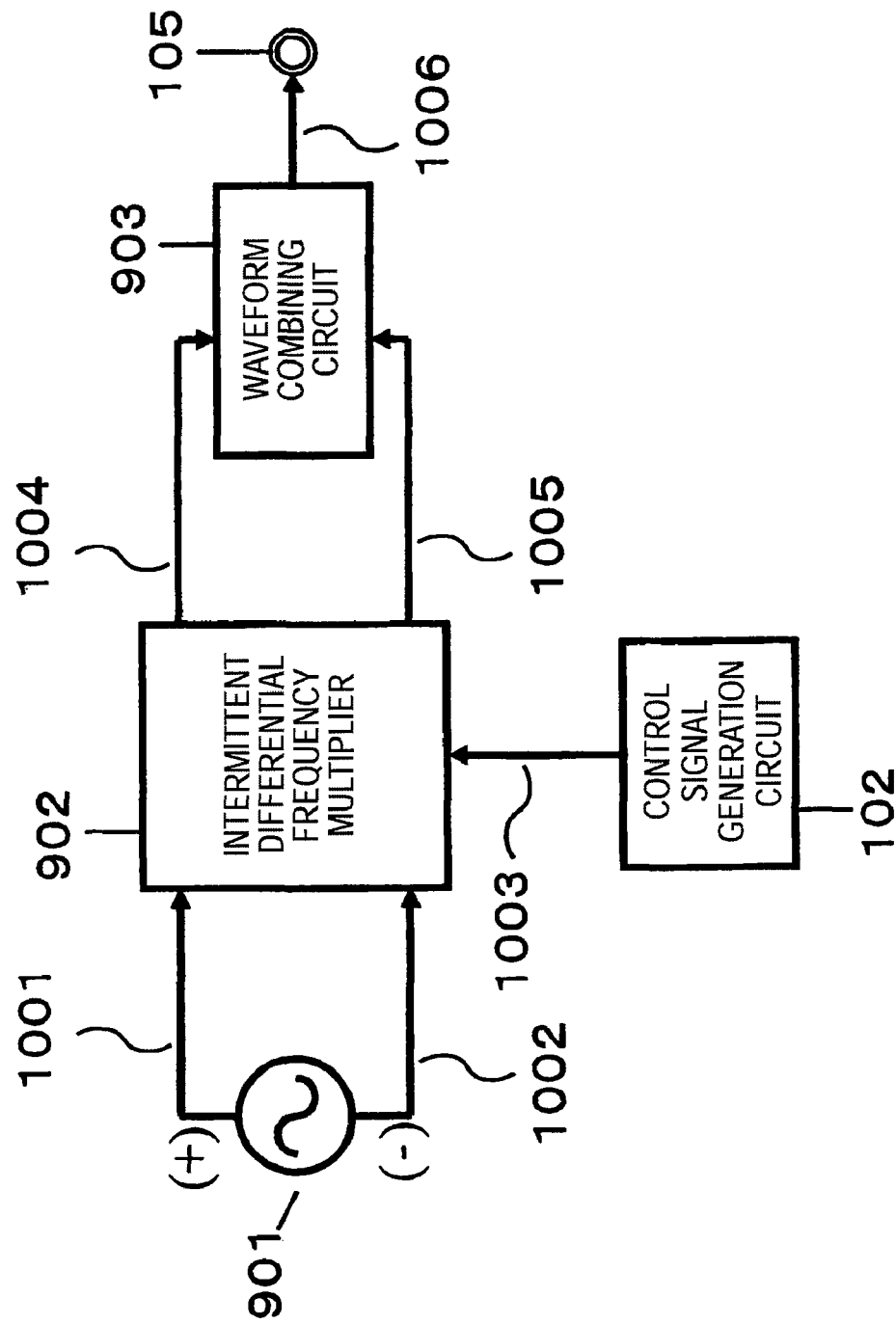
FIG. 9 is a drawing to show the circuit configuration of a short pulse generation circuit in a second embodiment of the invention.

FIG. 9 is a block diagram to show the configuration of a short pulse generation circuit in a second embodiment of the invention. The short pulse generation circuit differs from that in the first embodiment described above in that an intermittent differential frequency multiplier 902 is used in place of the intermittent frequency multiplier 103, that a differential oscillator 901 is used in place of the oscillator 101 at the preceding stage, that the filter 104 is not required, and that a waveform combining circuit 903 is used.

The circuit configuration is of differential type and the waveform combining circuit 903 is provided, so that the short pulse generation circuit for suppressing a spurious component without any filter and generating a short pulse signal having a high On/Off ratio and high CN can be realized with low power consumption.

Figure 10:
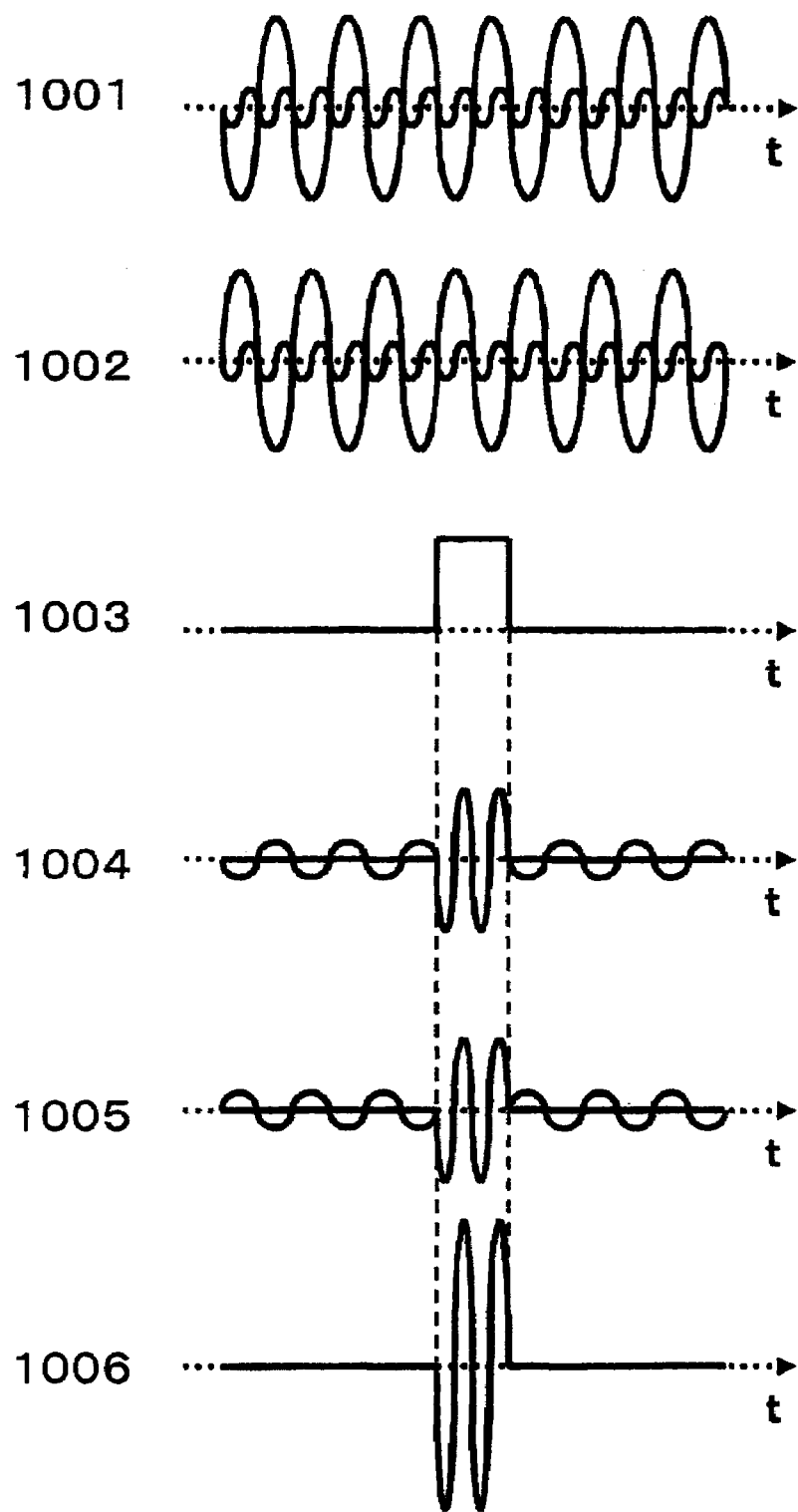
FIG. 10 is a drawing to show the characteristics of signal waveforms in the second embodiment of the invention.

FIG. 10 is a timing chart to show change in a control signal and input/output signals in the short pulse generation circuit shown in FIG. 9. Each vertical axis indicates voltage and each horizontal axis indicates the time. The operation of the short pulse generation circuit for generating a short pulse signal having a high On/Off ratio operating with low power consumption in the second embodiment will be discussed below with FIGS. 9 and 10:

Although the multiple number of the intermittent frequency multiplier is n (n: Positive integer), in the description to follow, it is assumed that the desired frequency of an output signal is f0, that the frequency of an output signal of the oscillator is f0/2, and that the intermittent frequency multiplier is a doubler circuit, as in the first embodiment.

The differential oscillator 901 outputs a signal 1001 and a signal 1002 from two output terminals. The signals 1001 and 1002 have components of frequency f0/2 in opposite phase and components of frequency f0 in phase. The signals 1001 and 1002 are input to two input terminals of the intermittent differential frequency multiplier 902.

On the other hand, a control circuit 1003 output from a control signal generation circuit 102 is input to the intermittent differential frequency multiplier 902, whereby a signal 1004 is output for the signal 1001 and a signal 1005 is output for the signal 1002 from two output terminals of the intermittent differential frequency multiplier 902.

The control circuit 1003 is input to the intermittent differential frequency multiplier 902, which then generates a short pulse signal. The operation of the intermittent differential frequency multiplier 902 to generate a short pulse signal is similar to that in the circuit configuration of single end type described in the first embodiment and therefore will not be discussed again.

The signals 1004 and 1005 output from the intermittent differential frequency multiplier 902 are input to the waveform combining circuit 903. The waveform combining circuit 903 combines the signals 1004 and 1005. That is, the components of the frequency f0/2 of the signals 1004 and 1005, in other words, the main components in an Off period are in opposite phase and thus the waveform combining circuit 903 cancels them.

On the other hand, the components of the frequency f0 of the signals 1004 and 1005, in other words, the main components in an On period are in phase and thus the waveform combining circuit 903 amplifies them. Therefore, a spurious component can be suppressed without the filter 104 used in the first embodiment and an output signal 1006 is output from an output terminal 105. Further, since a noise component is also canceled as it is in opposite phase, high CN can be realized.

However, the component of the frequency f0 also exists in the Off period and the component in the Off period is also subjected to waveform combining in phase and thus the On/Off ratio is as much as that of the short pulse generation circuit of single end type described in the first embodiment.

As described above, the circuit configuration is of differential type, so that the short pulse generation circuit for suppressing a spurious component without any filter and generating a short pulse signal having a high On/Off ratio and high CN can be realized with low power consumption.

Figure 11:
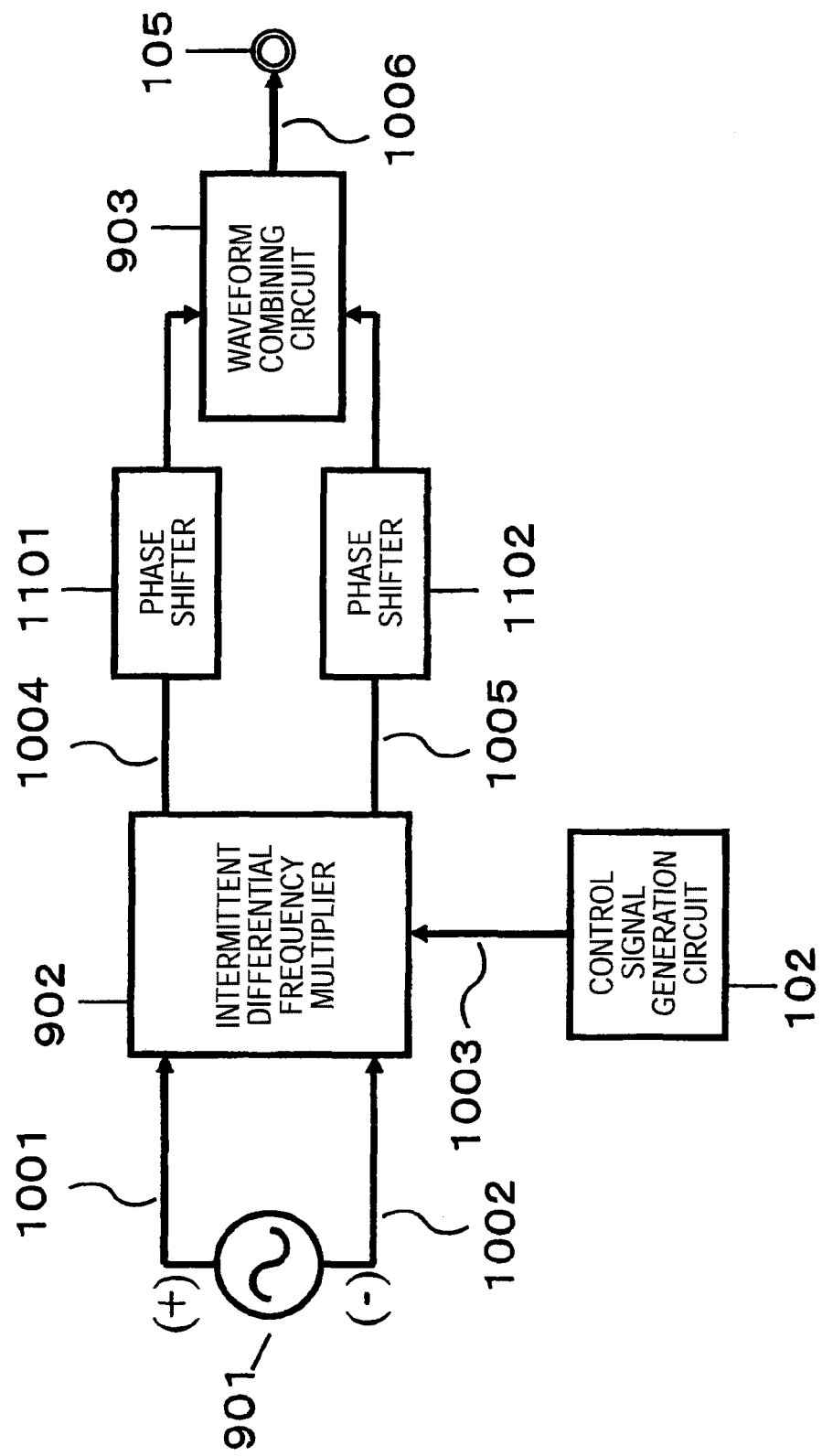
FIG. 11 is a drawing to show one example of the circuit configuration of the short pulse generation circuit in the second embodiment of the invention.

Although the f0/2 components of the signals 1004 and 1005 output from the two output terminals of the intermittent differential frequency multiplier 902 are in opposite phase and the f0 components are in phase, the phase relationship may a little shift because of the connection part of the circuit, etc., in which case a phase shifter 1101 and a phase shifter 1102 are provided as shown in FIG. 11, whereby phase control can be performed with high accuracy.

Although the short pulse generation circuit is implemented using the differential oscillator 901 and the intermittent differential frequency multiplier 902, if two intermittent frequency multipliers 103 are used in place of the intermittent differential frequency multiplier 902, a similar advantage can be provided.

Figure 12:
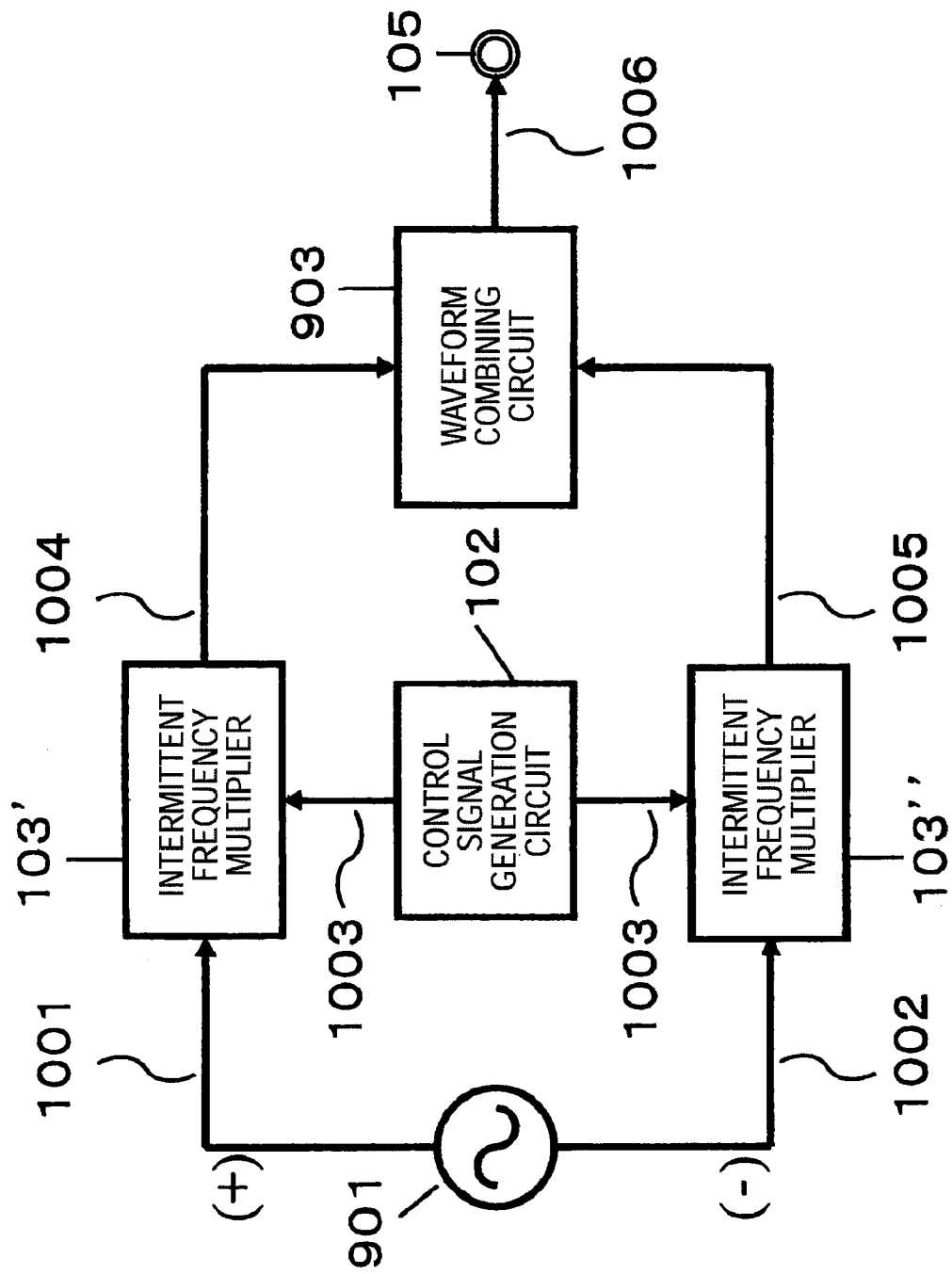
FIG. 12 is a drawing to show one example of the circuit configuration of the short pulse generation circuit in the second embodiment of the invention.

FIG. 12 shows another example of the short pulse generation circuit. The configuration differs from that in FIG. 9 in that the intermittent differential frequency multiplier 902 is replaced with two intermittent frequency multipliers 103. Signals 1001 and 1002 output from the differential oscillator 901 are input to an intermittent frequency multiplier 103' and an intermittent frequency multiplier 103' respectively.

The two intermittent frequency multipliers 103 intermittently operate according to the control signal 1003. The two intermittent frequency multipliers 103 output the signals 1004 and 1005. The waveform combining circuit 903 combines the signals 1004 and 1005 and outputs a signal 1006. The output terminal 105 outputs the output signal 1006. The circuit operation and the advantages are described above and therefore will not be discussed again. Also in the configuration in FIG. 12, phase shifters 1101 and 1102 are provided, whereby phase control can be performed in a similar manner with high accuracy.

In the description given above, the oscillation frequency of the oscillator 901 is a half the frequency of the output signal and the intermittent differential frequency multiplier 902 is a doubler circuit; however, the oscillation frequency of the oscillator 101 may be 1/(2n) of the frequency of the output signal and the intermittent frequency multiplier 103 may be a multiplying-by-2n circuit where n is a positive integer.

Third Embodiment

Figure 13:
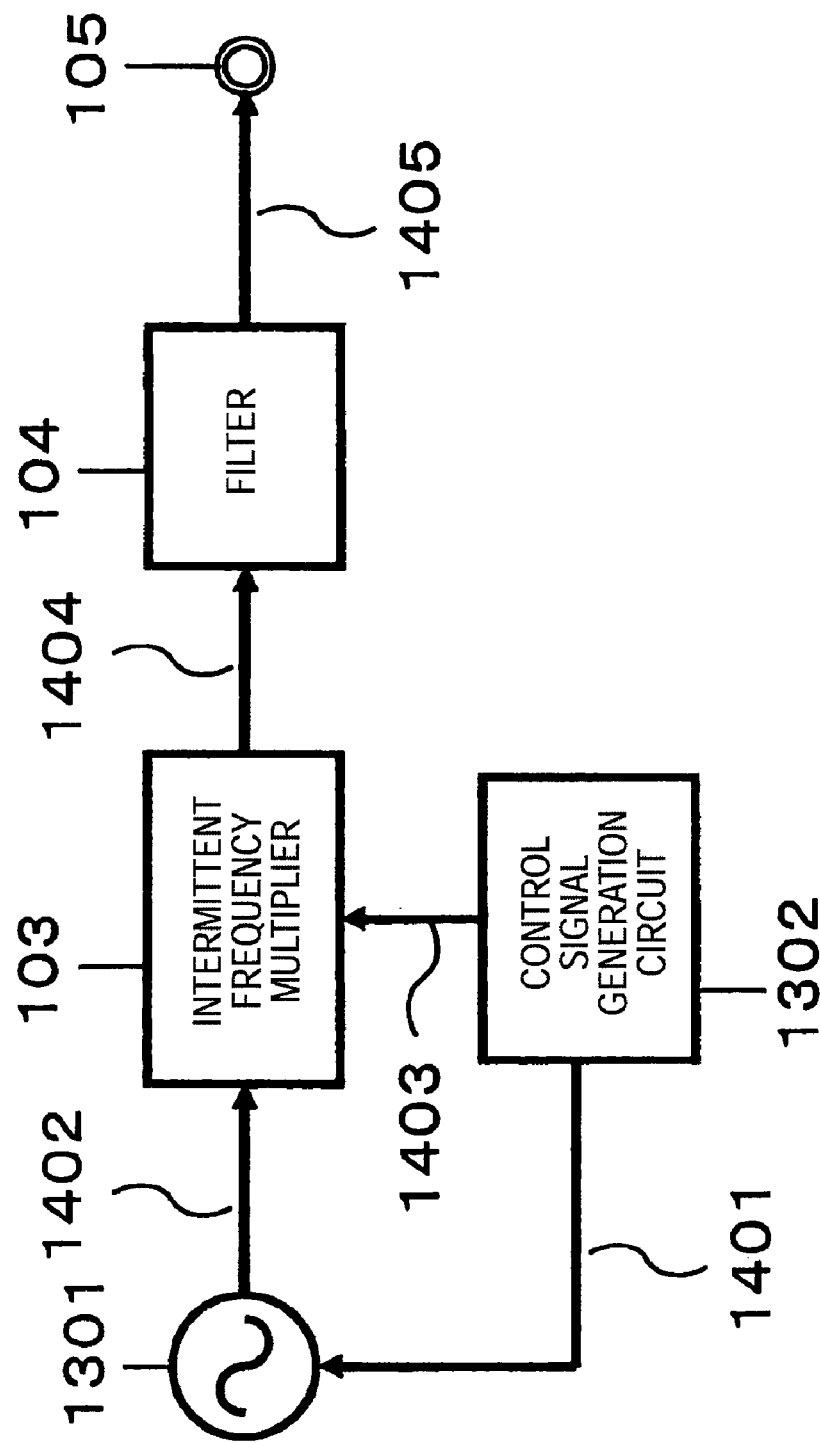
FIG. 13 is a drawing to show the circuit configuration of a short pulse generation circuit in a third embodiment of the invention.

FIG. 13 is a block diagram to show the configuration of a short pulse generation circuit in a third embodiment of the invention. The short pulse generation circuit differs from that in the first embodiment described above in that the oscillator 101 is replaced with an intermittent oscillator 1301, that the control signal generation circuit 102 is replaced with a control signal generation circuit 1302, and that a control signal 1401 output from the control signal generation circuit 1302 is input to the intermittent oscillator 1301.

The oscillator is intermittently operated like an intermittent frequency multiplier, whereby lower power consumption and a higher On/Off ratio can be realized. Here, it is assumed that a short pulse signal output from the intermittent oscillator 1301 and a control signal for controlling an intermittent frequency multiplier 103 differ in pulse width and the former has a longer pulse width than the latter.

Figure 14:
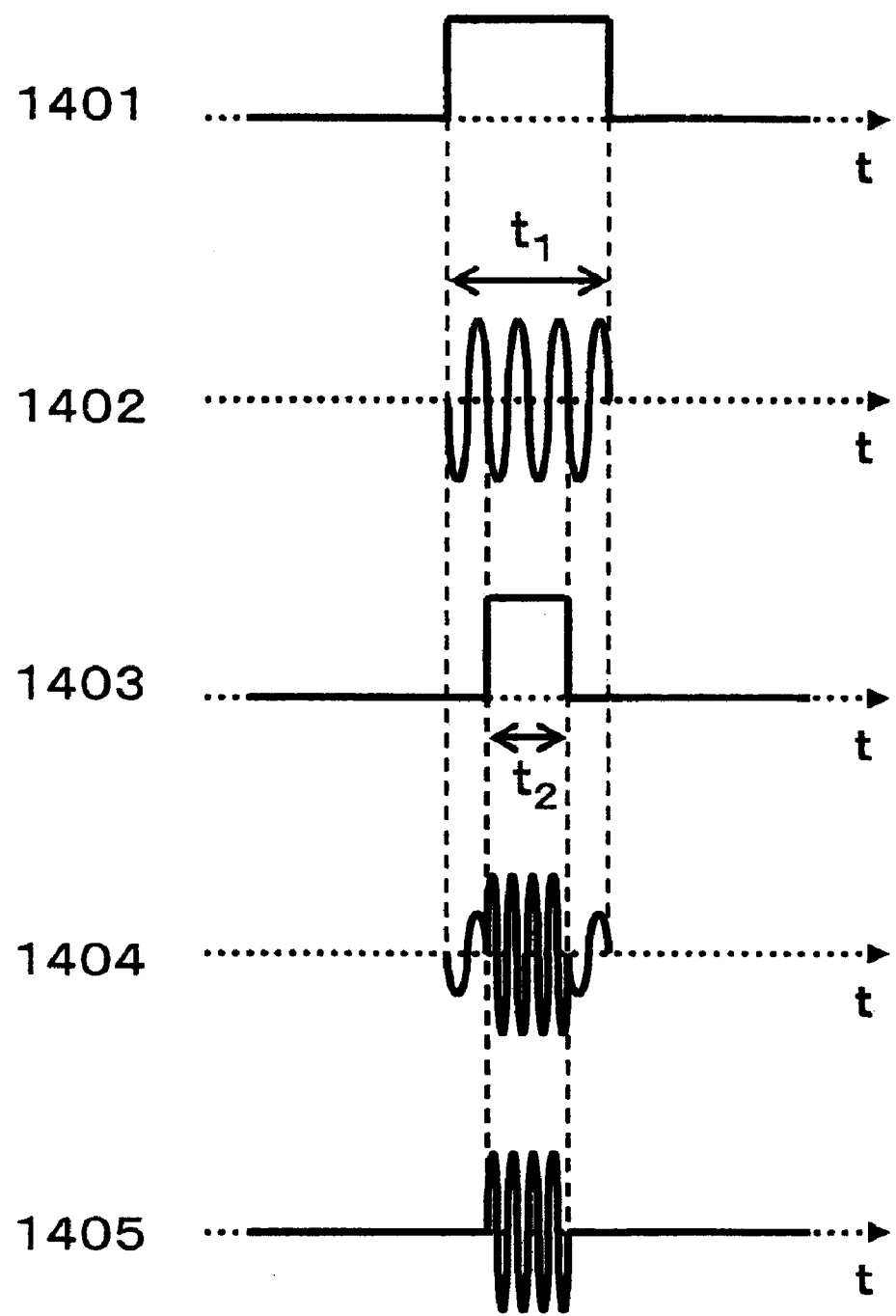
FIG. 14 is a drawing to show the characteristics of signal waveforms in the third embodiment of the invention.

FIG. 14 is a timing chart to show change in a control signal and input/output signals in the short pulse generation circuit shown in FIG. 13. Each vertical axis indicates voltage and each horizontal axis indicates the time. The operation of the short pulse generation circuit shown in the third embodiment will be discussed below with FIGS. 13 and 14:

Although the frequency multiplier of the intermittent frequency multiplier is n (n: Positive integer), in the description to follow, it is assumed that the desired frequency of an output signal is f0, that the frequency of an output signal of the oscillator is f0/2, and that the intermittent frequency multiplier is a doubler circuit, as in the first embodiment.

The intermittent oscillator 1301 operates at the frequency f0/2. On the other hand, the intermittent oscillator 1301 intermittently operates according to the control signal 1401 output from the control signal generation circuit 1302 and outputs a short pulse signal 1402 of a pulse width t1.

In the operation principle of the intermittent oscillator 1301, the operation point of active elements (transistor and FET) forming the intermittent oscillator 1301 is controlled by the control signal 1401. The operation point is controlled, whereby the intermittent oscillator 1301 satisfies an oscillation condition in an On period of the control signal and does not satisfy the oscillation condition in an Off period and thus intermittently oscillates. The intermittent oscillator 1301 outputs the short pulse signal 1402 to the intermittent frequency multiplier 103.

On the other hand, the control signal generation circuit 1302 inputs a control signal 1403 to the intermittent frequency multiplier 103. Accordingly, the intermittent frequency multiplier 103 intermittently operates. This operation is described in detail in the first embodiment and therefore will not be discussed again. However, it is assumed that a pulse width t2 of the control signal 1403 for controlling the intermittent operation of the intermittent frequency multiplier 103 is shorter than the pulse width t1 of the short pulse signal 1402 output from the intermittent oscillator 1301.

Further, it is assumed that the short pulse signal 1402 rises and then the control signal 1403 rises and that the control signal 1403 falls and then the short pulse signal 1402 falls. In so doing, if the short pulse signal 1402 is input to the intermittent frequency multiplier 103 for performing distortion operation, intermodulation does not occur. The intermittent frequency multiplier 103 outputs a short pulse signal 1404 to a filter 104. The filter 104 suppresses a spurious component of the short pulse signal 1404 and outputs a short pulse signal 1405. This short pulse signal 1405 is output from an output terminal 105.

As described above, the oscillator is intermittently operated like the intermittent frequency multiplier, whereby lower power consumption and a higher On/Off ratio can be realized. The intermittent frequency multiplier 103 is described as the single end type, but may be of differential type as described in the second embodiment and the intermittent oscillator 1301 at the preceding stage may be of differential type together. In so doing, the advantages that the need for the filter 104 is eliminated and that high CN can also be realized can be provided additionally.

In the description given above, the oscillation frequency of the intermittent oscillator 1301 is a half the frequency of the output signal and the intermittent frequency multiplier 103 is a doubler circuit; however, the oscillation frequency of the intermittent oscillator 1301 may be 1/n of the frequency of the output signal and the intermittent frequency multiplier 103 may be a multiplying-by-n circuit where n is a positive integer.

Although it is assumed that the intermittent oscillator does not satisfy the oscillation condition in the Off period, the oscillation condition may be satisfied also in the Off period and the signal level in the Off period may be lower than the signal level in the On period.

Fourth Embodiment

Figure 15:
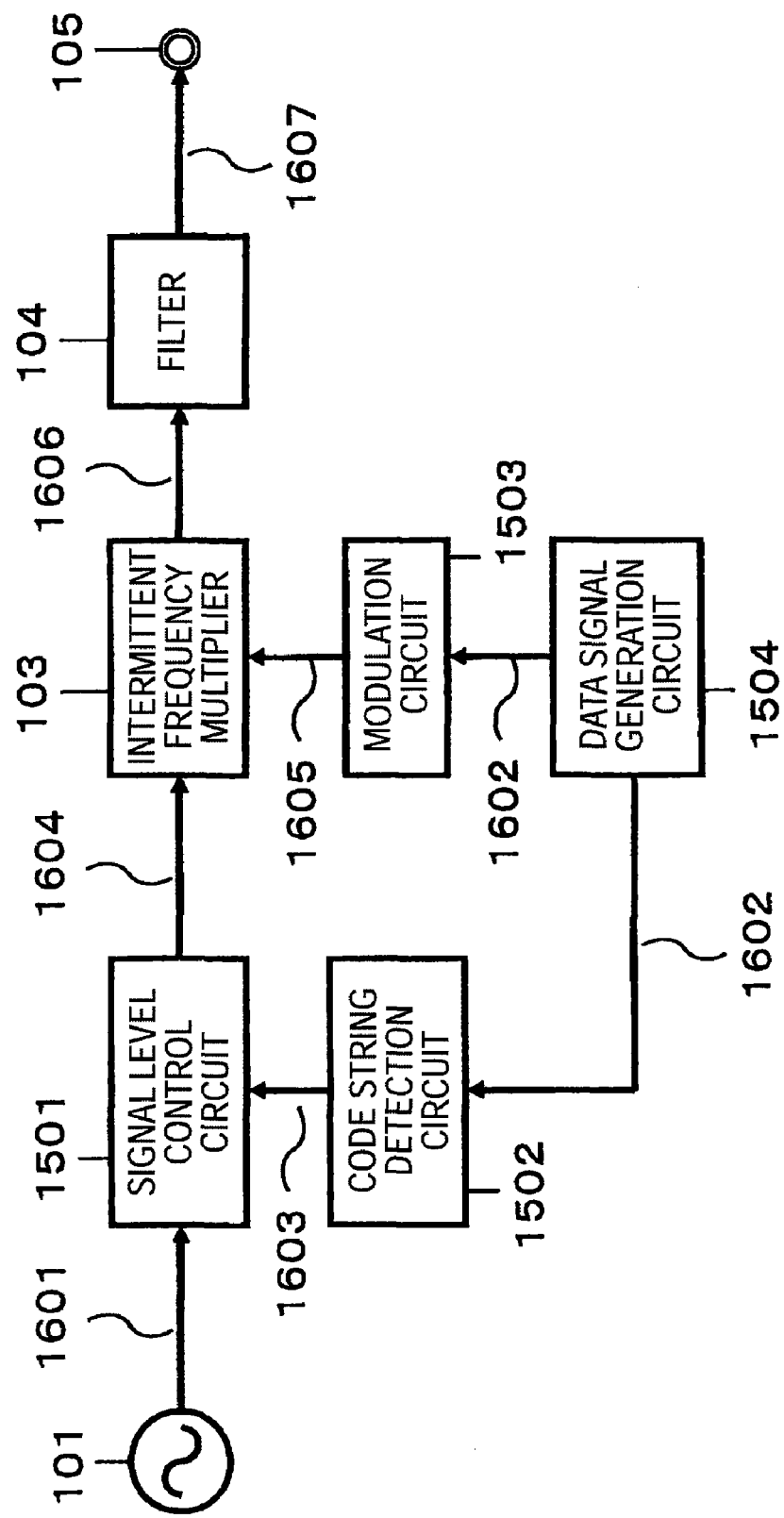
FIG. 15 is a drawing to show the circuit configuration of a modulator in a fourth embodiment of the invention.

FIG. 15 is a block diagram to show the configuration of a modulator using a short pulse generation circuit in a fourth embodiment of the invention. The configuration differs from that in the first embodiment described above in that a signal level control circuit 1501, a code string detection circuit 1502, a modulation circuit 1503, and a data signal generation circuit 1504 are provided in place of the control signal generation circuit 102.

Figure 16:
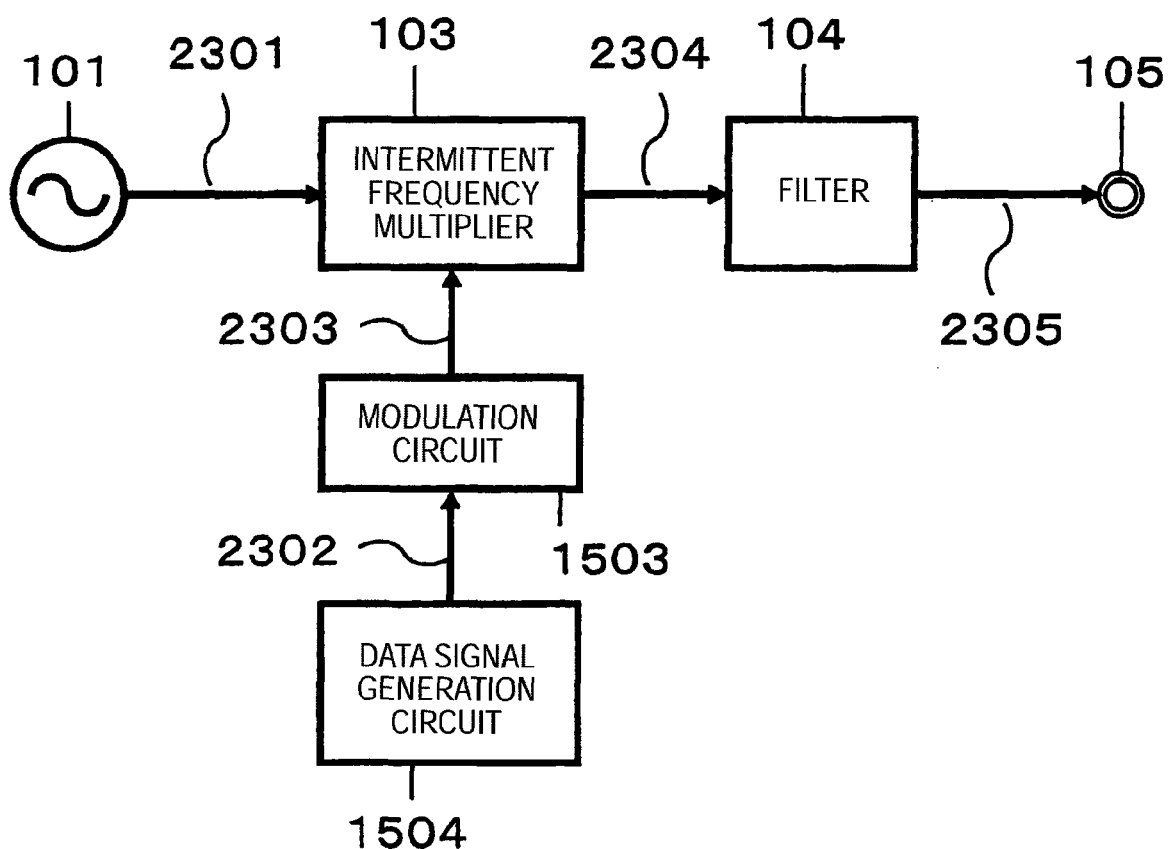
FIG. 16 is a drawing to show the configuration of a modulator in the fourth embodiment of the invention.

A problem that can occur when a short pulse generation circuit using an intermittent frequency multiplier 103 is applied to a modulator will be discussed. FIG. 16 shows a modulator provided with the modulation circuit 1503 with the control signal generation circuit 102 replaced with the data signal generation circuit 1504 in the short pulse generation circuit shown in the first embodiment. The intermittent frequency multiplier 103 operates in accordance with a code string output from the data signal generation circuit 1504 and outputs a short pulse signal. Accordingly, an OOK modulator for carrying digital information on the amplitude value of the short pulse signal can be realized.

Figure 17:
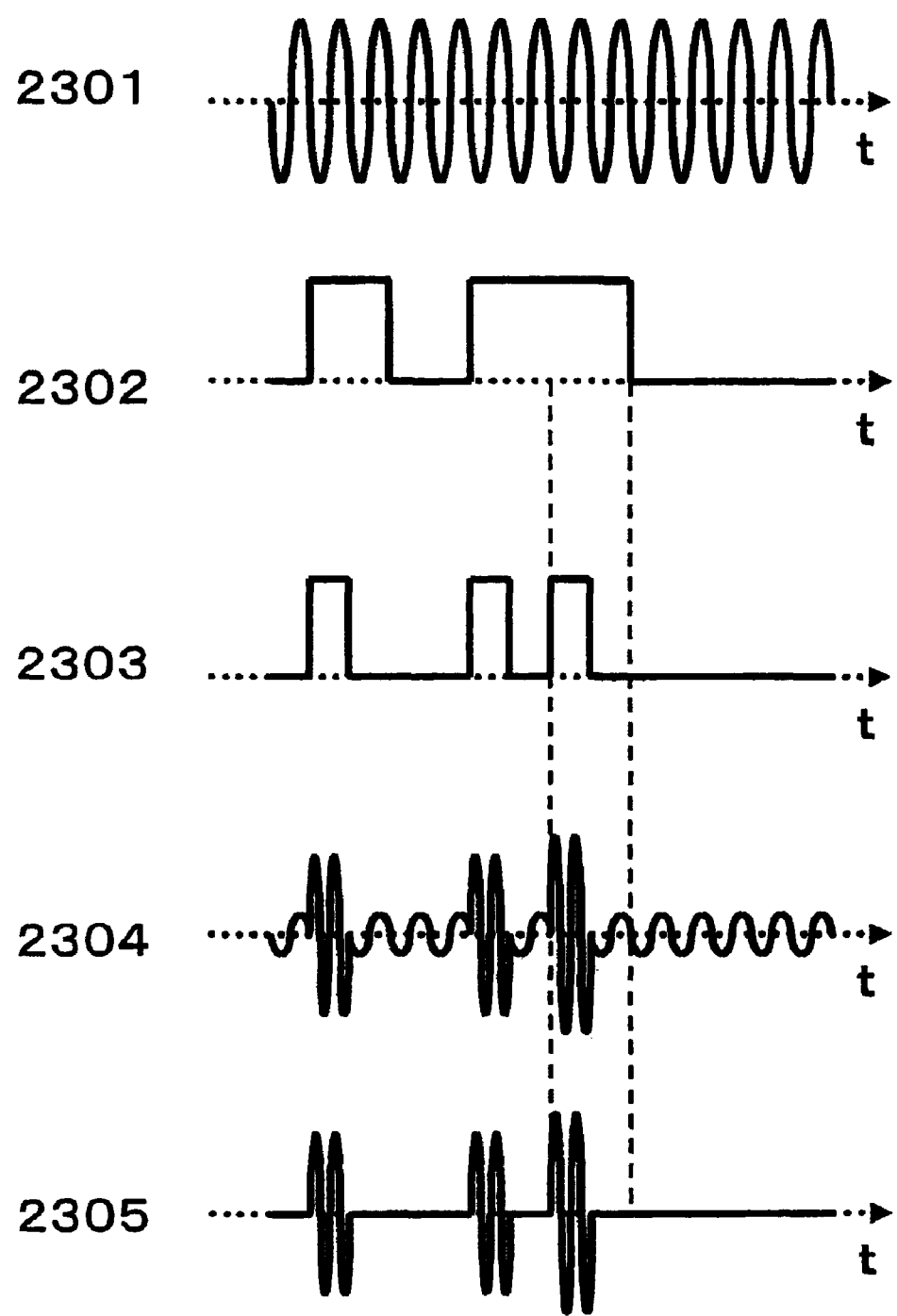
FIG. 17 is a drawing to show the characteristics of signal waveforms in the fourth embodiment of the invention.

FIG. 17 is a timing chart to show change in a control signal and input/output signals in the modulator using the short pulse generation circuit shown in FIG. 16. Each vertical axis indicates voltage axis and each horizontal axis indicates the time axis. The problem that can occur when the intermittent frequency multiplier 103 is applied to the modulator will be discussed below with FIGS. 16 and 17: Although the frequency multiplier of the intermittent frequency multiplier is n (n: Positive integer), in the description to follow, it is assumed that the desired frequency of an output signal is f0, that the frequency of an output signal of the oscillator is f0/2, and that the intermittent frequency multiplier is a doubler circuit, as in the first embodiment.

A signal 2301 output from an oscillator 101 is input to the intermittent frequency multiplier 103. The data signal generation circuit 1504 outputs a data signal 2302. The modulation circuit 1503 modulates the data signal 2302 and outputs a control signal 2303. The intermittent frequency multiplier 103 intermittently operates according to the input control signal 2303. The operation principle of the intermittent operation is described in detail in the first embodiment and therefore will not be discussed again.

When the intermittent frequency multiplier 103 is intermittently controlled by the control signal 2303, if the control signal is an RZ code, the output amplitude of the following code "1" of code string "01" and the output amplitude of the following code "1" of code string "11" differ in the inclination in a transient state. This topic will be discussed in detail with reference to FIGS. 18 and 19.

Specifically, if code "1" is successive like the code string "11," the charge of the control signal of the preceding code "1" is left in the control signal of the following code "1" and the inclination in the transient state of the control signal of the following code "1" becomes steep in the presence of the remaining charge.

Figure 18:
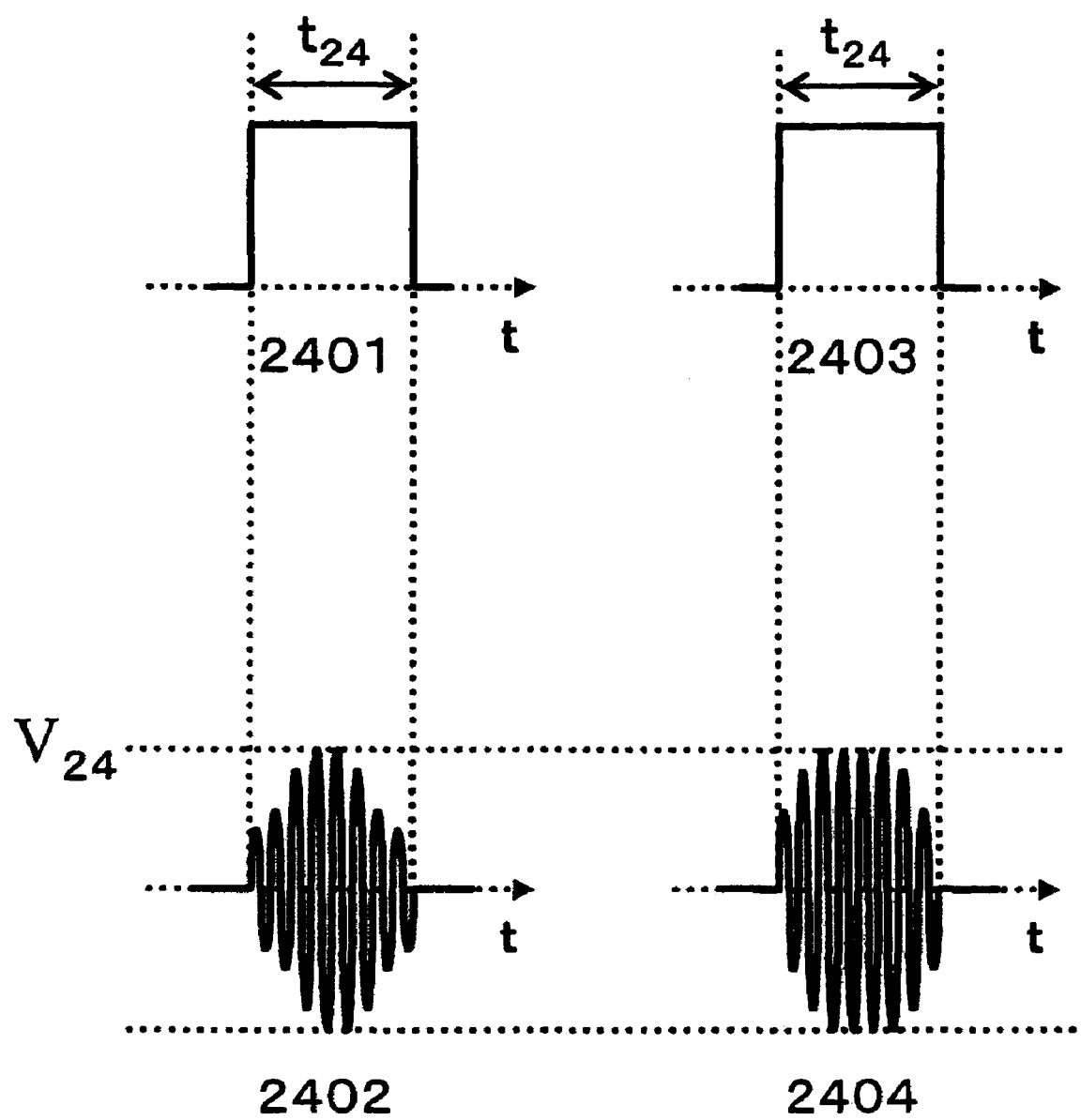
FIG. 18 is a drawing to show the characteristics of output waveforms in the fourth embodiment of the invention.

As the inclination in the transient state of the control signal becomes steep, inevitably the inclination in the transient state of an output signal also becomes steep. FIG. 18 shows the waveforms at this time. A waveform 2401 is a control signal waveform of the preceding code "1" of the code string "11," a waveform 2402 is an output waveform from the intermittent frequency multiplier 103 at the time, a waveform 2403 is a control signal waveform of the following code "1" of the code string "11," and a waveform 2404 is an output waveform from the intermittent frequency multiplier 103 at the time.

In FIG. 18, a pulse width t24 of the control signal is longer than the sum total of the rising time and the falling time of the output waveform and thus the maximum amplitudes of both the waveforms 2402 and 2404 reach an amplitude level V24 in a stationary state.

Figure 19:
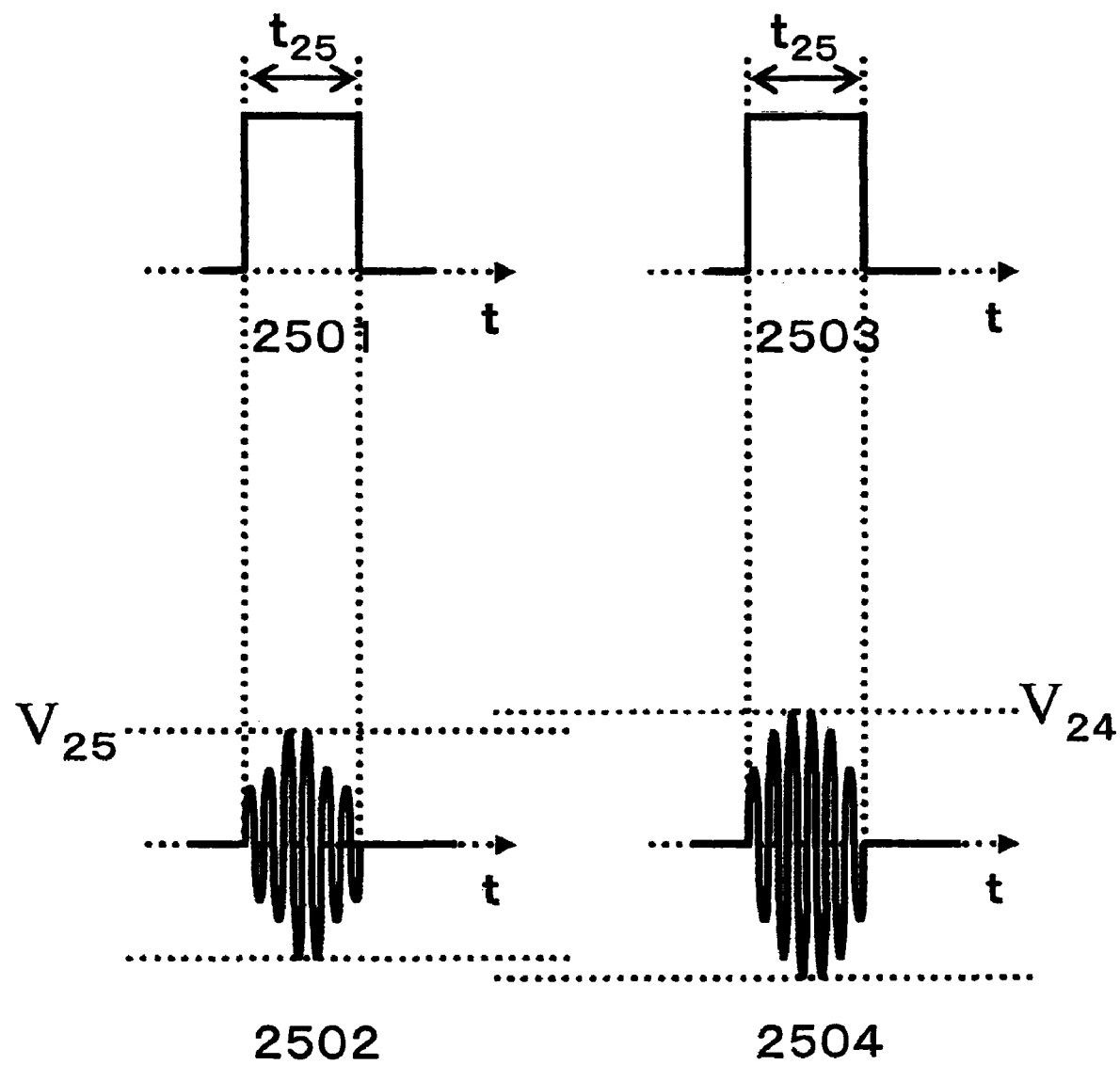
FIG. 19 is a drawing to show the characteristics of output waveforms in the fourth embodiment of the invention.

FIG. 19 is a drawing to show a control signal waveform and an output signal waveform when a control signal having a shorter pulse width than the control signal of the waveforms 2401 and 2403 is used. A waveform 2501 is a control signal waveform of the preceding code "1" of the code string "11," a waveform 2502 is an output waveform from the intermittent frequency multiplier 103 at the time, a waveform 2503 is a control signal waveform of the following code "1" of the code string "11," and a waveform 2504 is an output waveform from the intermittent frequency multiplier 103 at the time.

In FIG. 19, a pulse width t25 of the control signal is shorter than the sum total of the rising time and the falling time of the output waveform and thus the maximum amplitude of the waveform 2502 whose output rising is slow does not reach the amplitude level V24 in the stationary state. On the other hand, the maximum amplitude of the waveform 2504 reaches the amplitude level V24 in the stationary state and the peak value of the output signal varies depending on the code string. The phenomenon in which the peak value of the output signal varies depending on the code string can occur when the pulse width of the control signal is very short.

The intermittent frequency multiplier 103 outputs a signal 2304 whose peak value varies depending on the code string and a filter 104 suppresses a spurious component of the signal 2304 and an output signal 2305 is obtained. Thus, when the short pulse generation circuit using the intermittent frequency multiplier is applied to the modulator, if the pulse width of the control signal (namely, output signal of the modulation circuit) is short, a problem of the peak value varying depending on the code string can occur.

The fourth embodiment is the invention for solving this problem and the input signal level is controlled according to a code string, whereby a modulator wherein the inclination in a transient state of an output waveform is constant independently of the code string can be realized.

Figure 20:
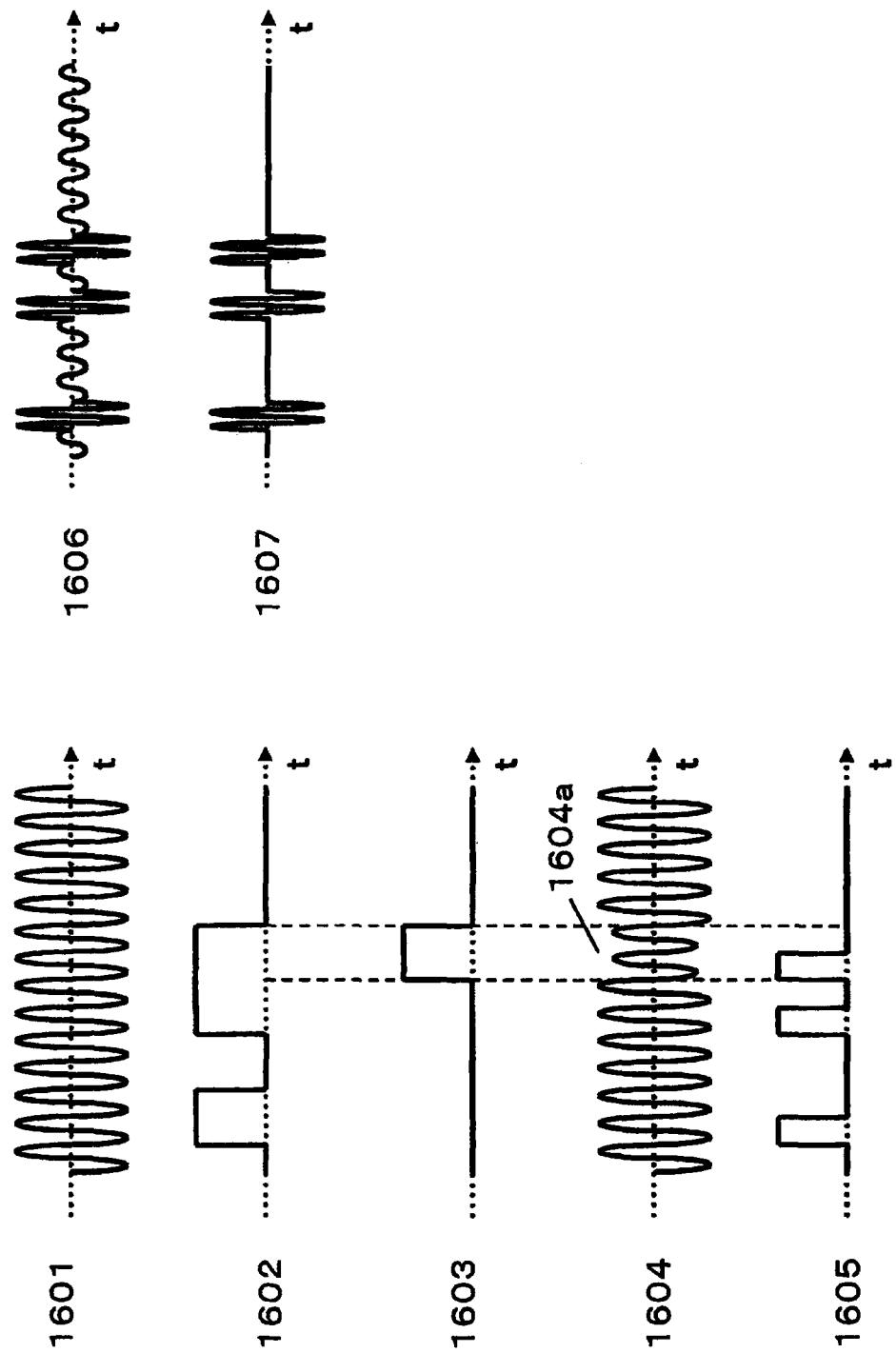
FIG. 20 is a drawing to show the characteristics of signal waveforms in the fourth embodiment of the invention.

FIG. 20 is a timing chart to show change in control signals and input/output signals in the modulator using the short pulse generation circuit shown in FIG. 15. Each vertical axis indicates voltage and each horizontal axis indicates the time. The operation of the modulator using the short pulse generation circuit shown in the fourth embodiment will be discussed with FIGS. 15 and 20.

The oscillator 101 outputs a signal 1601 to the signal level control circuit 1501. On the other hand, the data signal generation circuit 1504 outputs a control signal 1602 to the code string detection circuit 1502.

The code string detection circuit 1502 detects the following code "1" when a code string is "11," and outputs a pulsed control signal 1603 to the signal level control circuit 1501 at the timing of the code "1."

The signal level control circuit 1501 adjusts the amplitude value of the input signal 1601 in accordance with the control signal 1603 so as to lessen the amplitude value at a timing at which a pulse signal exists in the control signal 1603.

This adjustment is made to cancel a steep inclination in the transient state in the following code "1" of the code string "11" using the fact that the inclination in the transient state of the output waveform becomes moderate if the input signal level is small. The adjustment amount of the amplitude value of the input signal 1601 can be previously determined. The signal level control circuit 1501 outputs a signal 1604 to the intermittent frequency multiplier 103.

On the other hand, the data signal generation circuit 1504 outputs a data signal 1602. The modulation circuit 1503 converts the data signal 1602 into a control signal 1605 and inputs the control signal to the intermittent frequency multiplier 103. The intermittent frequency multiplier 103 is intermittently operated by the control signal 1605, thereby intermittently multiplying the signal 1604.

At the time, the timing of an amplitude level adjustment part 1604a in the signal 1604 and the timing of the part of the following code "1" of the code string "11" are matched with each other, whereby the inclination in the transient state of the short pulse signal in the following code "1" of the code string "11" becomes moderate as compared with the case where the amplitude value of the signal 1604 is not controlled in a code list.

Here, the amplitude value of the part 1604a of the input signal 1604 is adjusted so that the inclination in the transient state of the short pulse signal in the following code "1" of the code string "11" becomes the same as or the proximity of the inclination of the short pulse signal in the code "1" of a different code list.

In so doing, a signal 1606 with a constant inclination or a roughly constant inclination can be generated independently of the code list. The intermittent frequency multiplier 103 outputs the signal 1606 to the filter 104. The filter 104 suppresses a spurious component of the signal 1606 and outputs a short pulse signal 1607. The short pulse signal 1607 is output from the output terminal 105.

As described above, the input signal level is controlled according to the code string, whereby the modulator using a short pulse signal with a constant inclination in the transient state of the output waveform independently of the code string and having a high On/Off ratio can be realized with low power consumption.

The circuit configuration for adjusting the input signal level according to the code list and making the inclination in the transient state of the short pulse signal output from the intermittent frequency multiplier constant or roughly constant independently of the code list has been described, but further the bias value of an FET forming a part of the intermittent frequency multiplier may be controlled according to a code list.

Figure 21:
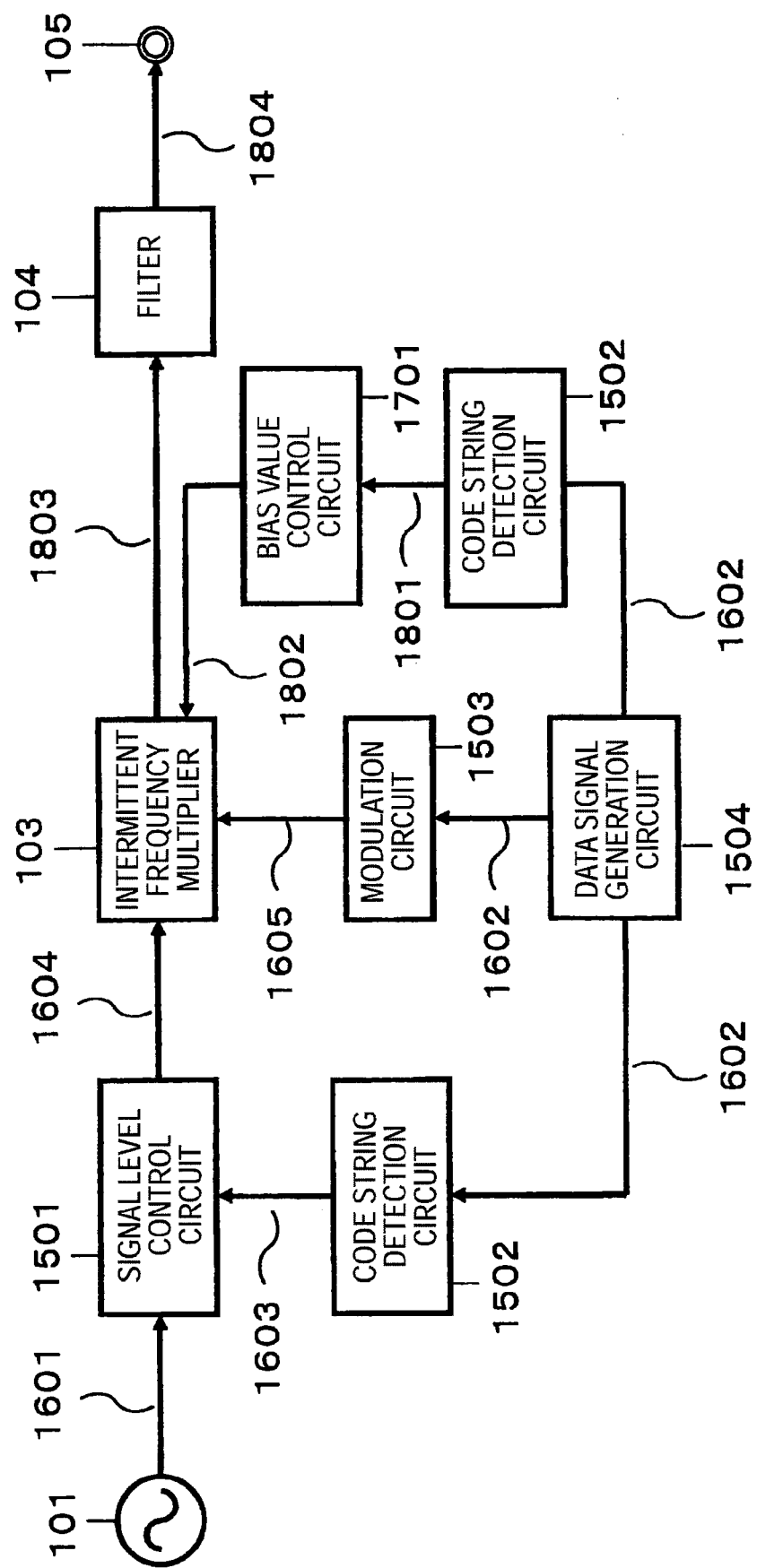
FIG. 21 is a drawing to show one example of the circuit configuration of the modulator in the fourth embodiment of the invention.

FIG. 21 shows another example of the modulator using the short pulse generation circuit. The configuration differs from that in FIG. 15 in that a bias value control circuit 1701 and one additional code string detection circuit 1502 are further provided.

The bias value of the FET forming a part of the intermittent frequency multiplier 103 is controlled according to a code list, so that the modulator using a short pulse signal not only with a constant or roughly constant inclination in the transient state of the output waveform independently of the code string, but also with a constant or roughly constant amplitude value in a stationary state and having a high On/Off ratio can be realized with low power consumption.

Figure 22:
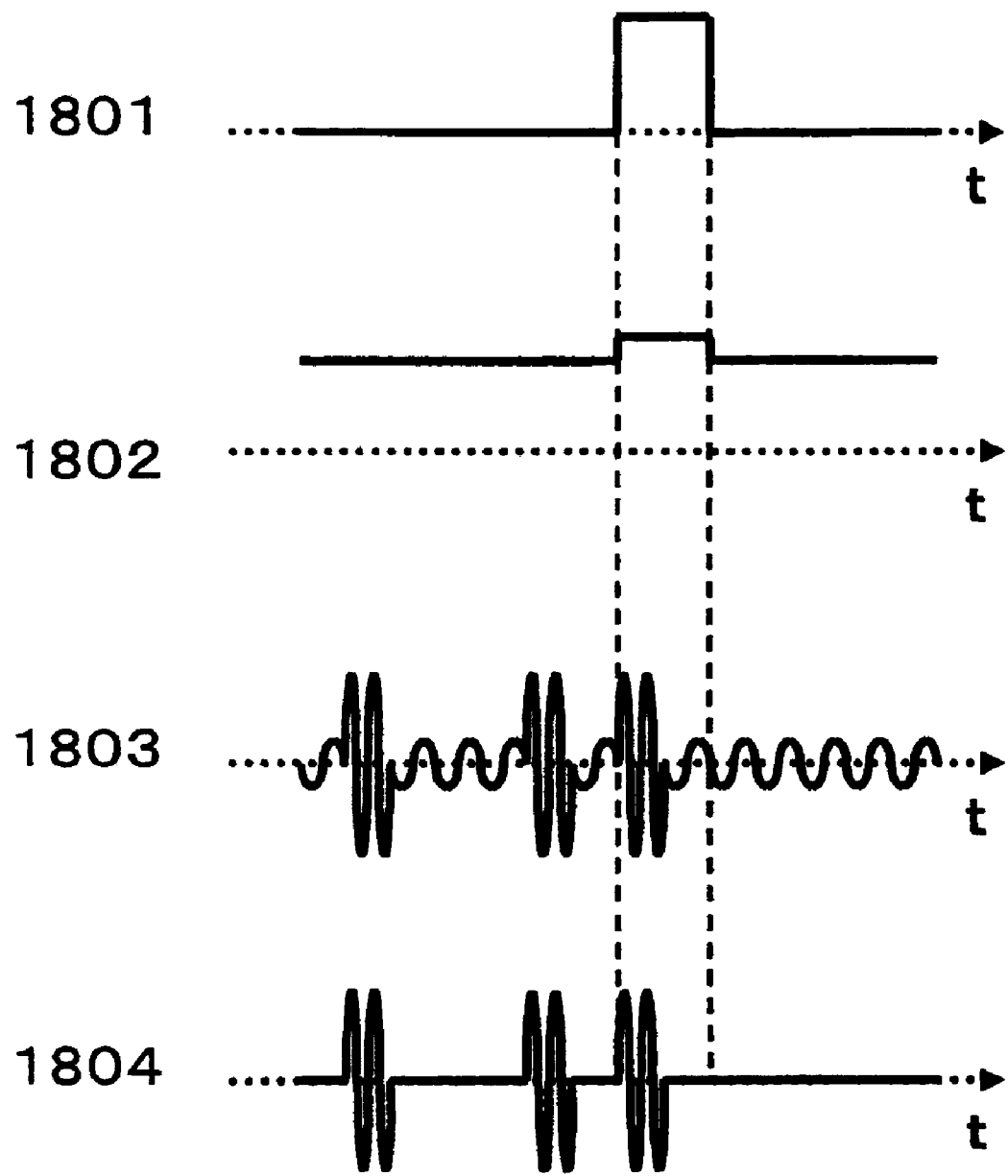
FIG. 22 is a drawing to show the characteristics of signal waveforms in the fourth embodiment of the invention.

FIG. 22 is a timing chart to show change in control signals and input/output signals in the modulator using the short pulse generation circuit shown in FIG. 21. Each vertical axis indicates voltage and each horizontal axis indicates the time. The operation of the modulator using the short pulse generation circuit shown in the fourth embodiment will be discussed with FIGS. 21 and 22. The operation of intermittently multiplying the input signal 1604 according to the control signal 1605 by the intermittent frequency multiplier 103 is described in the configuration in FIG. 15 and therefore will not be discussed again.

In the configuration in FIG. 21, the data signal generation circuit 1504 outputs a data signal 1602. The code string detection circuit 1502 detects the following code "1" when a code string is "11," generates a pulsed control signal 1801 at the timing of the code, and inputs the control signal to the bias value control circuit 1701.

The bias value of the FET forming a part of the intermittent frequency multiplier 103 is controlled by a control signal 1802 output from the bias value control circuit 1701. Here, it is assumed that the intermittent frequency multiplier 103 in the configuration in FIG. 21 has the configuration in FIG. 3, and the bias value controlled by the control signal 1802 is Vds.

In the configuration in FIG. 15, the input signal level is decreased at the timing of the following "1" when the code string is "11" for making the inclination in the transient state moderate; at the same time, the amplitude value in the stationary state decreases. Then, Vds is increased at the timing of the following "1" when the code string is "11" in the control signal 1802 for increasing the amplitude value in the stationary state.

Figure 23:
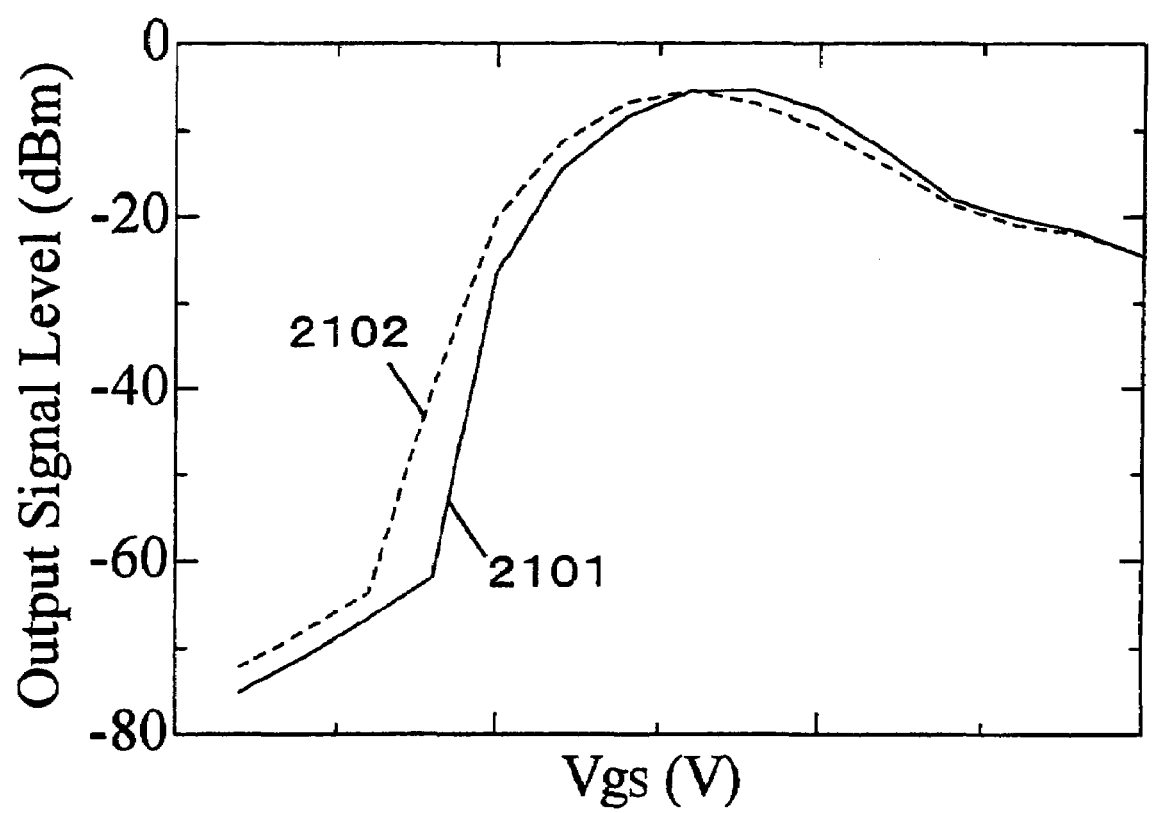
FIG. 23 is a drawing to show the characteristic of the relationship between control signal voltage value and output signal level in the fourth embodiment of the invention.

FIG. 23 is a drawing to show characteristic curves of output level change relative to Vgs change of the intermittent frequency multiplier 103. A characteristic curve 2101 is a characteristic curve when the input signal level is small and Vds is large relative to a characteristic curve 2102; the characteristic curve 2101 has a moderate inclination in the transient state as compared with the characteristic curve 2102, but the maximum amplitude level of the characteristic curve 2101 is as much as that of the characteristic curve 2102. The vertical axis is not normalized.

The following code "1" of the code string "11" is made to correspond to the characteristic curve 2101 and the code "1" in any other code list is made to correspond to the characteristic curve 2102, whereby the inclination in the transient state of the output waveform and the maximum amplitude value can be made constant independently of the code list. A signal 1803 thus generated is input to the filter 104. The filter 104 suppresses a spurious component of the signal 1803 and outputs a signal 1804 and the signal 1804 is output from the output terminal 105.

Figure 24:
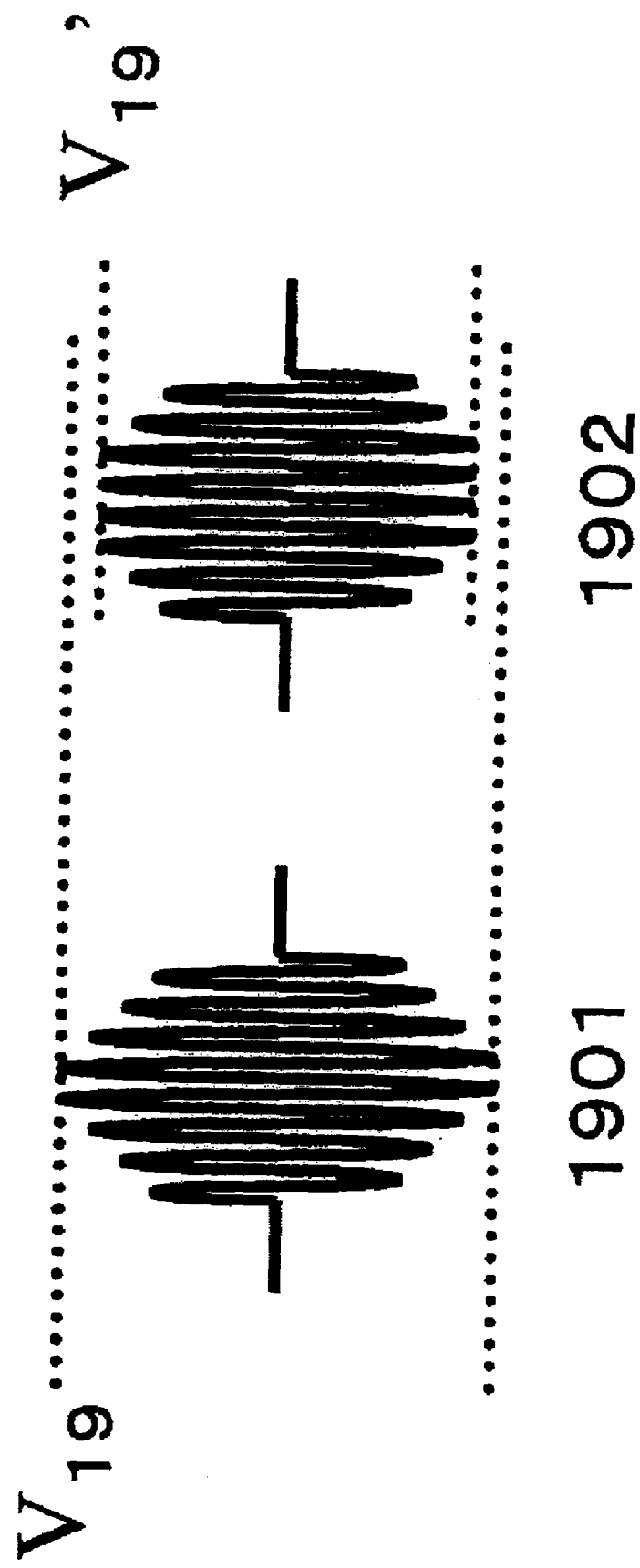
FIG. 24 is a drawing to show the characteristics of output waveforms in the fourth embodiment of the invention.
Figure 25:
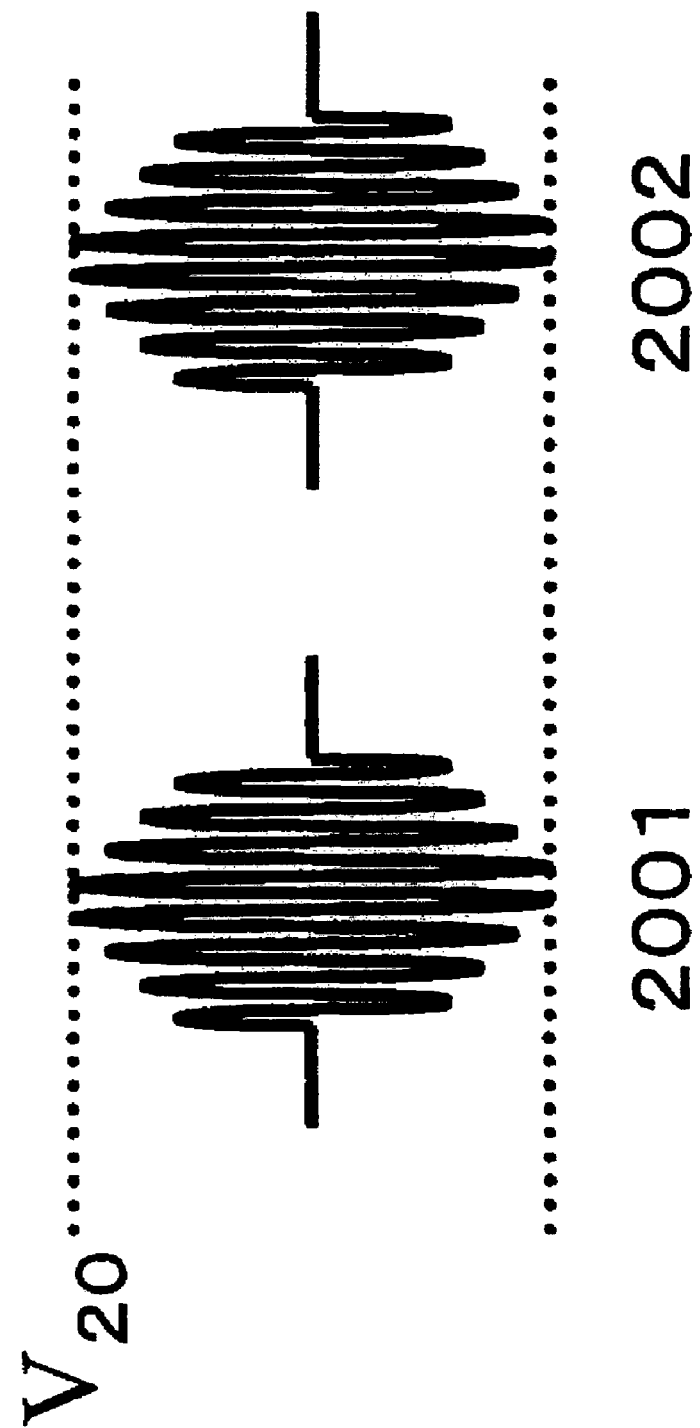
FIG. 25 is a drawing to show the characteristics of output waveforms in the fourth embodiment of the invention.

The output waveforms in the configuration in FIG. 21 and the configuration in FIG. 15 are compared with FIGS. 24 and 25. FIG. 24 shows the output waveforms corresponding to the configuration in FIG. 15; a waveform 1901 is an output signal waveform corresponding to any code "1" other than the following code "1" of a code string "11" and a waveform 1902 is an output signal waveform corresponding to the following code "1" of the code string "11."

FIG. 25 shows the output waveforms corresponding to the configuration in FIG. 21; a waveform 2001 is an output signal waveform corresponding to any code "1" other than the following code "1" of a code string "11" and a waveform 2002 is an output signal waveform corresponding to the following code "1" of the code string "11." The waveforms 1901 and 1902 equal in the inclination in the transient state, but differ in the maximum amplitude value in the stationary state as V19 and V19'. On the other hand, the waveforms 2001 and 2002 equal in the inclination in the transient state and also equal in the maximum amplitude value in the stationary state.

As described above, the bias value of the FET forming a part of the intermittent frequency multiplier 103 is adjusted according to the code list and is controlled according to the code list, so that the modulator using a short pulse signal not only with a constant or roughly constant inclination in the transient state of the output waveform independently of the code string, but also with a constant or roughly constant amplitude value in a stationary state and having a high On/Off ratio can be realized with low power consumption. In FIG. 21, the signal output from one code string detection circuit 1502 may be supplied to the signal level control circuit 1501 and the bias value control circuit 1701.

Here, the code string detection circuit detects the following code "1" of the code string "11" and controls the input signal level and the bias value, but a method of detecting the code "1" when a code string is "01," controlling the input signal level and the bias value, and adjusting to the inclination in the transient state of the output signal in the following code "1" of the code string "11" and the peak value may be adopted. In so doing, the inclination in the transient state of the output signal can be uniformed as steep and the peak value of the output signal can be uniformed at a high level and the communication quality can be improved.

The circuit configuration of the intermittent frequency multiplier 103 has been described as that in FIG. 3, but if any of the configurations shown in FIGS. 6 to 8 is adopted, a similar advantage can be provided. In FIG. 6, the bias value to be controlled is Vds as in FIG. 3; in FIGS. 7 and 8, the bias value to be controlled is Vgs.

Although the control signal has been described as RZ code, a similar problem also occurs with NRZ code; the output amplitude of the second code "1" of code string "1101" and the output amplitude of the third code "1" of the code string "1101" differ in the inclination in the transient state, but this problem can be solved by the method described in the fourth embodiment.

Fifth Embodiment

Figure 26:
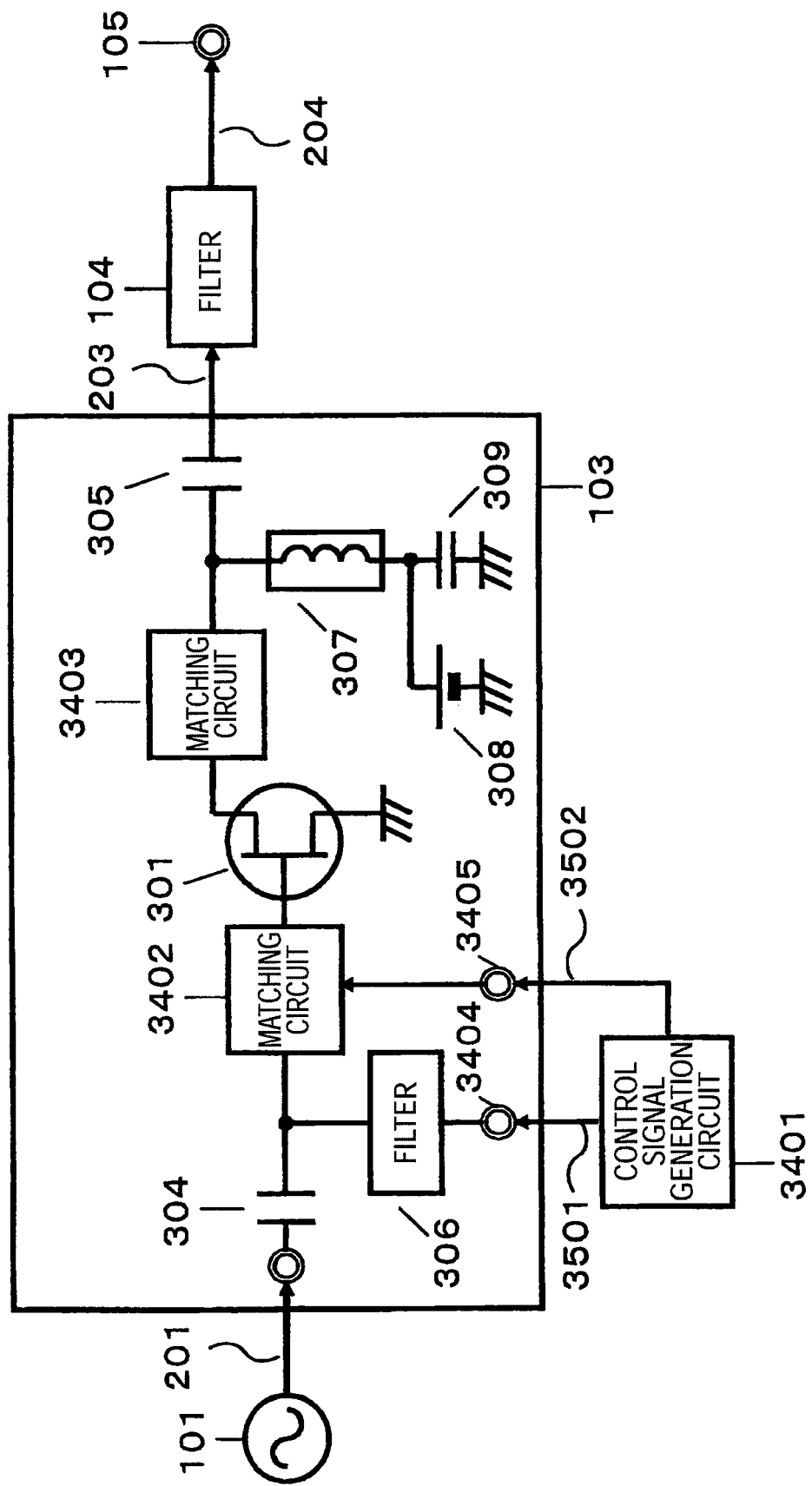
FIG. 26 is a drawing to show the circuit configuration of a short pulse generation circuit in a fifth embodiment of the invention.

FIG. 26 is a block diagram to show the configuration of a short pulse generation circuit in a fifth embodiment of the invention. The short pulse generation circuit differs from that in the first embodiment described above in that matching circuits 3402 and 3403 are provided in place of the matching circuits 302 and 303 and that a control signal generation circuit 3401 provided in place of the control signal generation circuit 102 has two output terminals and a control signal output from one output terminal is input to the matching circuit 3402.

The impedance of the matching circuit 3402 is intermittently controlled by a control signal, whereby a high On/Off ratio can be realized even with a control signal of small amplitude.

Figure 27:
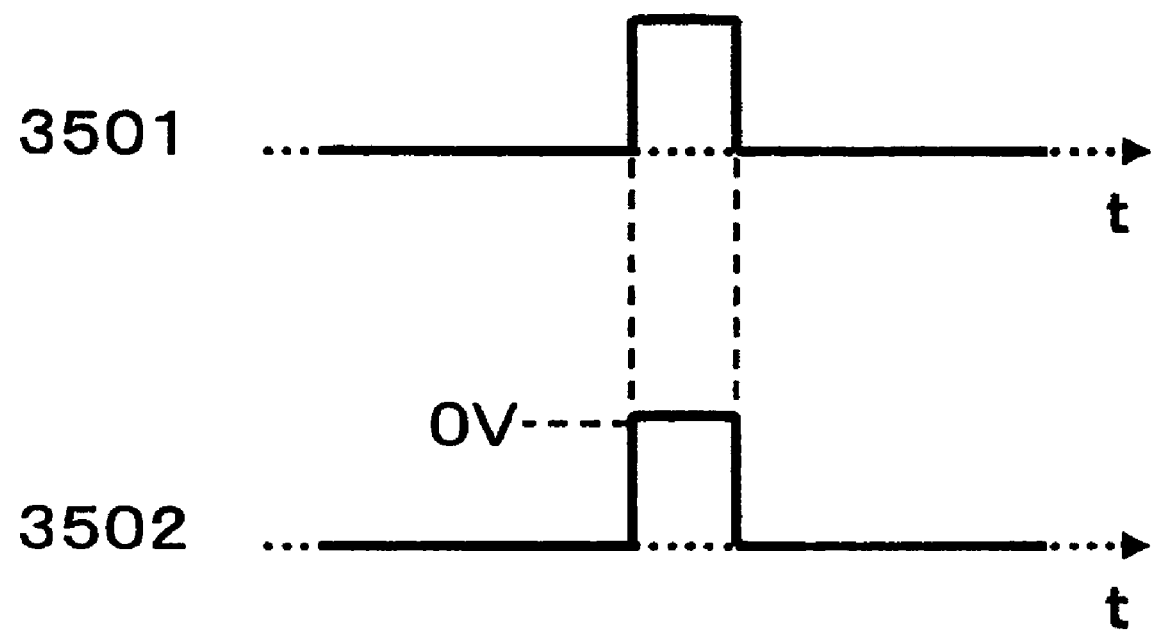
FIG. 27 is a drawing to show the characteristics of signal waveforms in the fifth embodiment of the invention.
Figure 28:
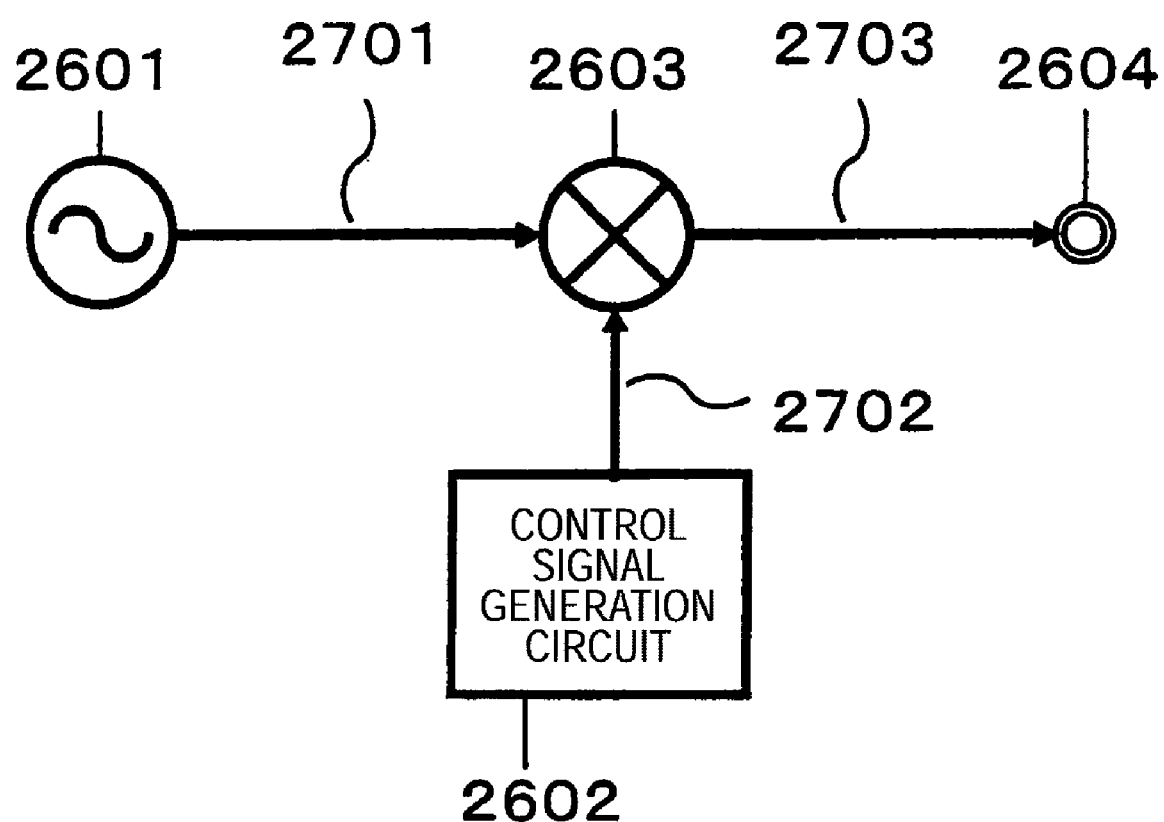
FIG. 28 is a drawing to show the circuit configuration of a short pulse generation circuit of a related art.
Figure 29:
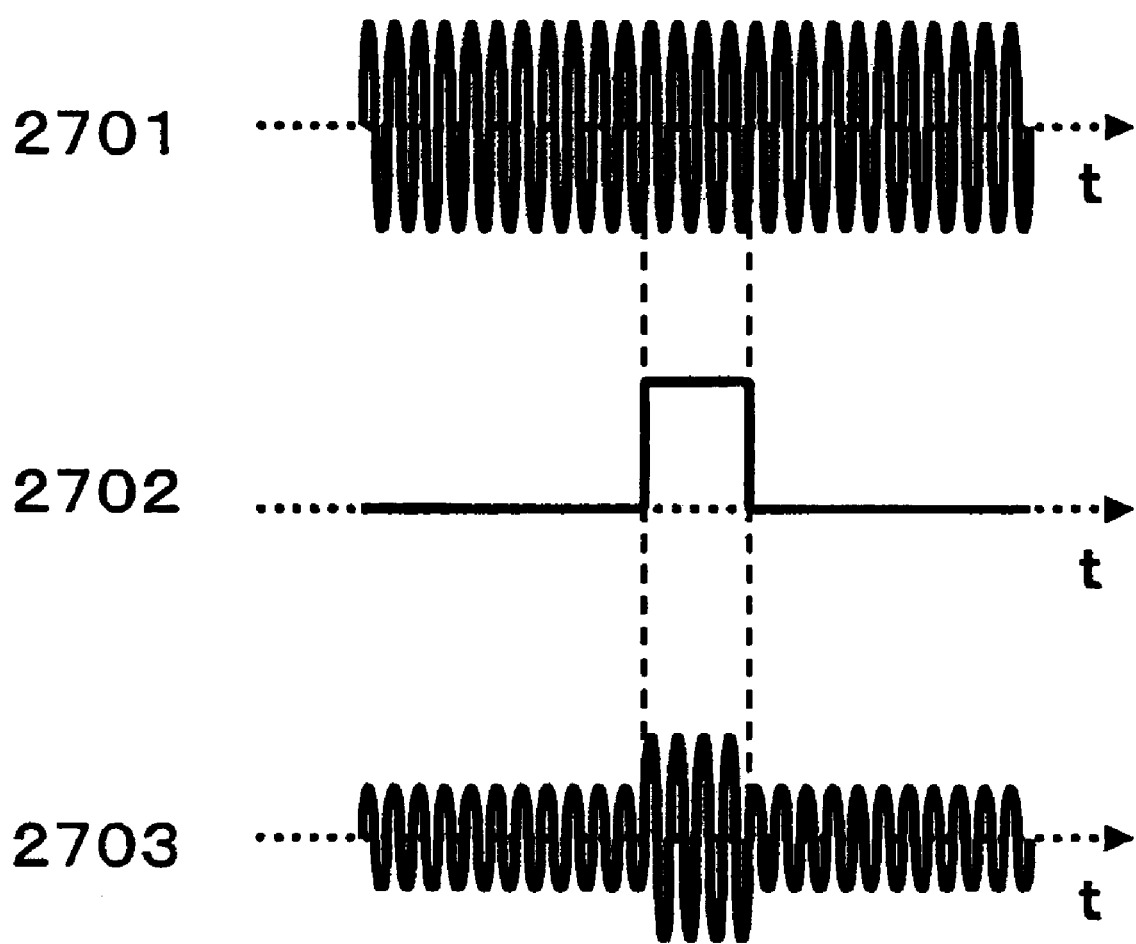
FIG. 29 is a drawing to show a control signal waveform in the related art.
Figure 30:
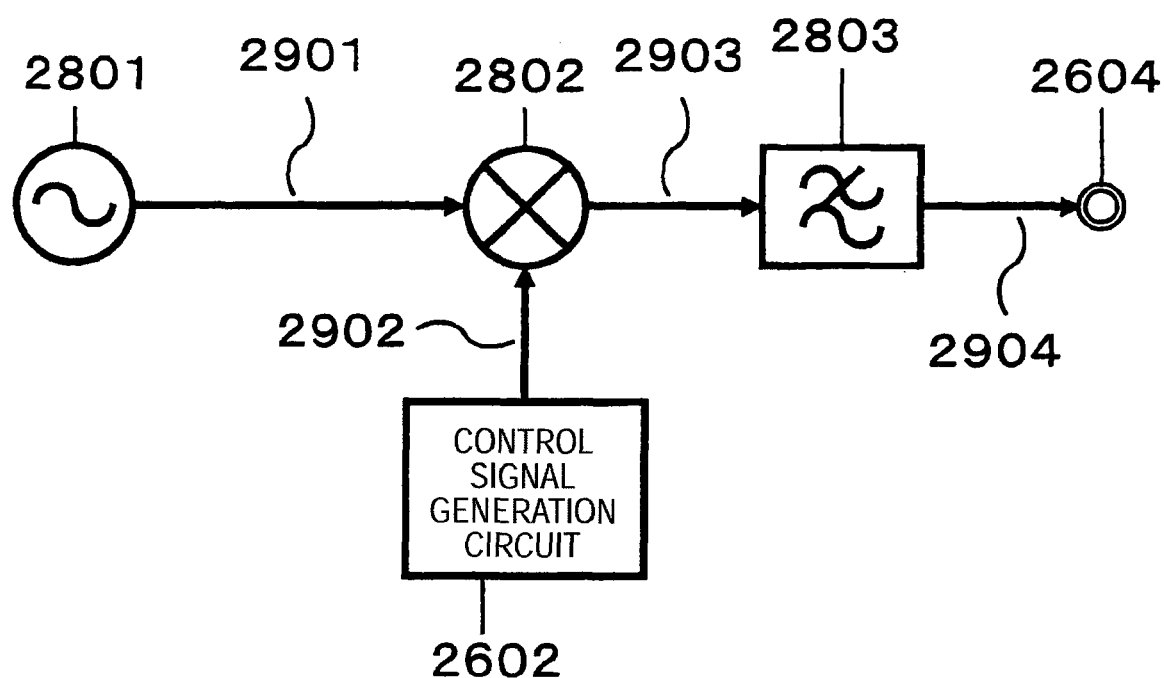
FIG. 30 is a drawing to show the circuit configuration of a short pulse generation circuit of a related art.
Figure 31:
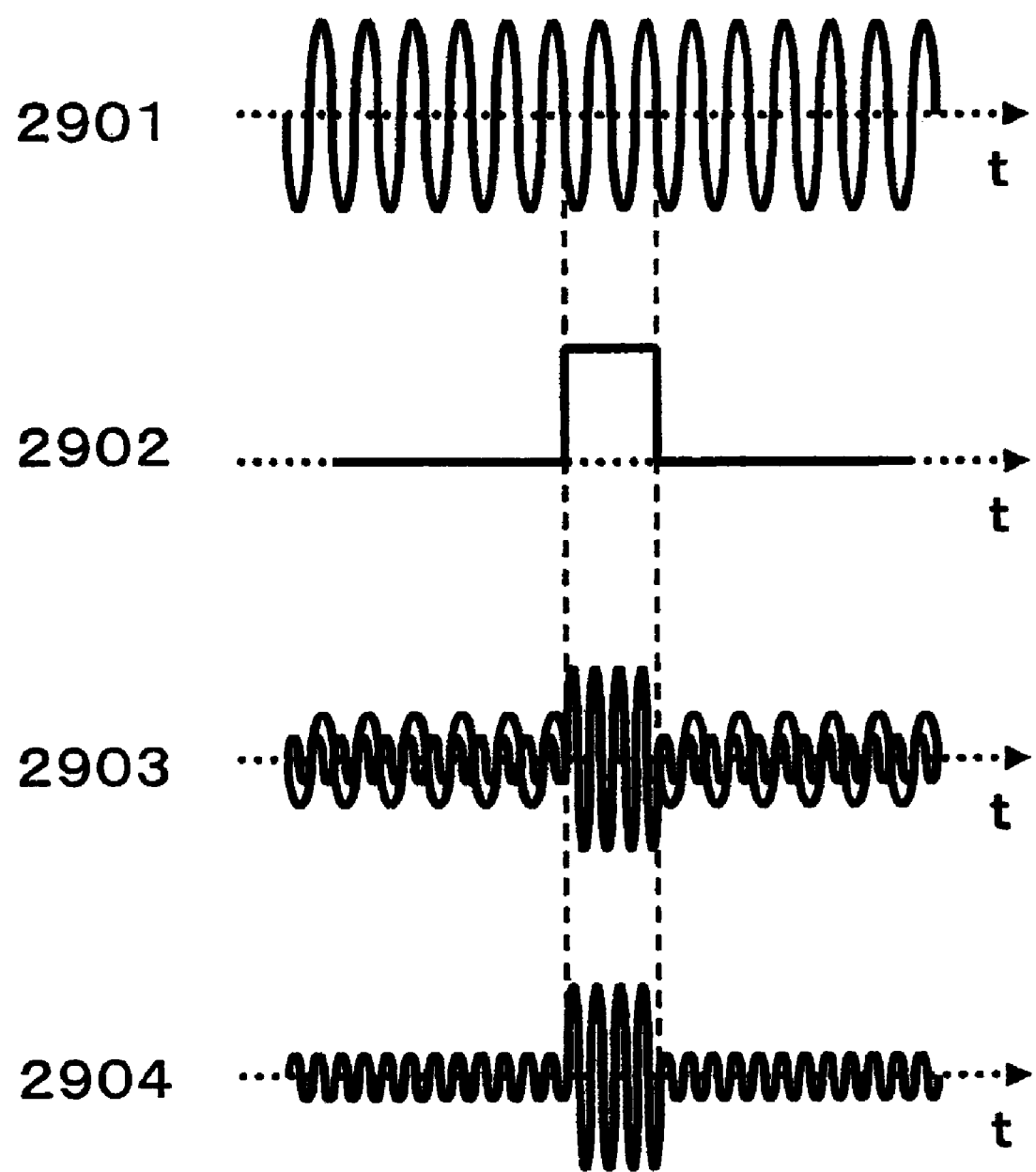
FIG. 31 is a drawing to show a control signal waveform in the related art.
Figure 32:
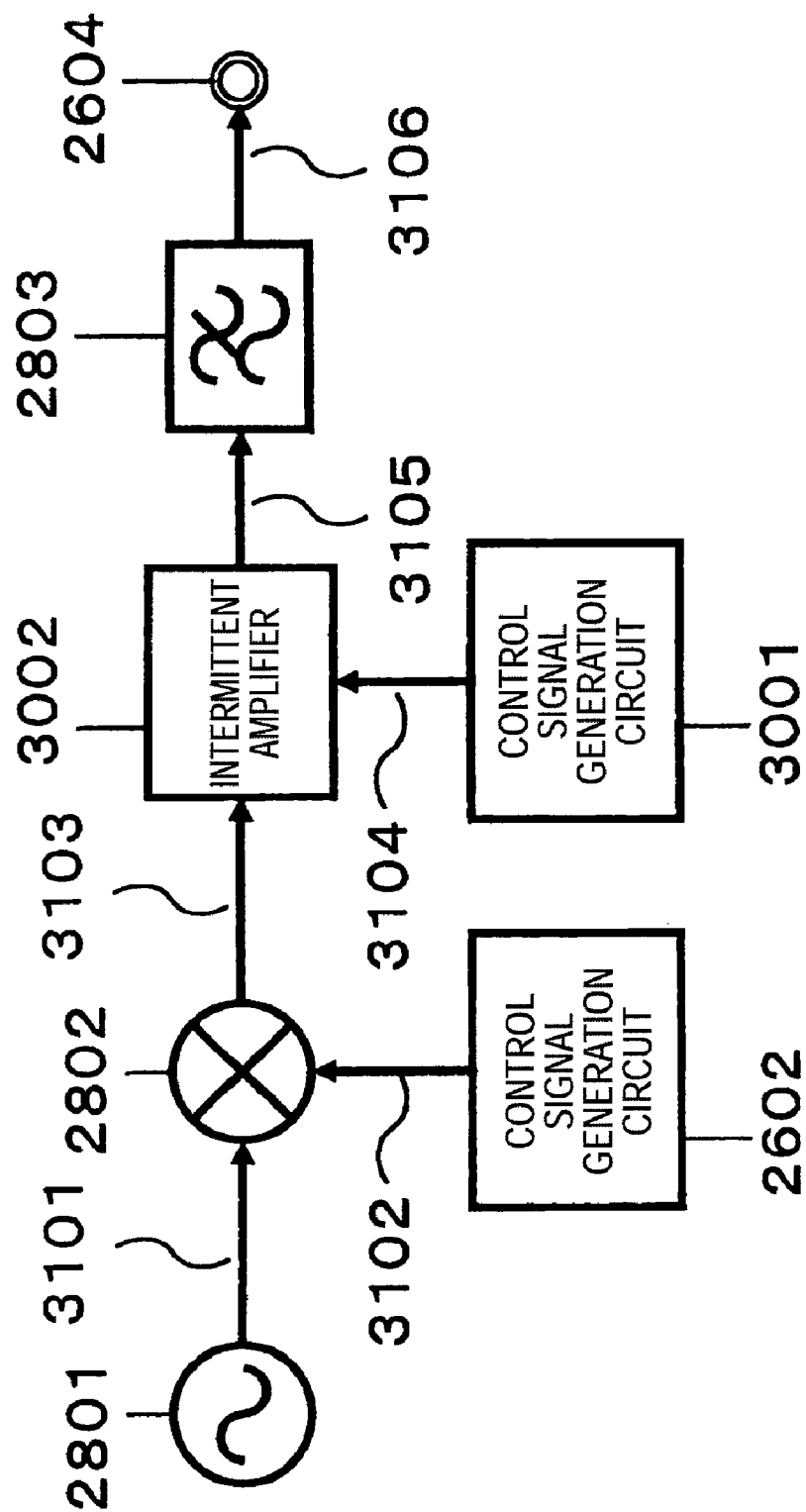
FIG. 32 is a drawing to show the circuit configuration of a short pulse generation circuit of a related art.
Figure 33:
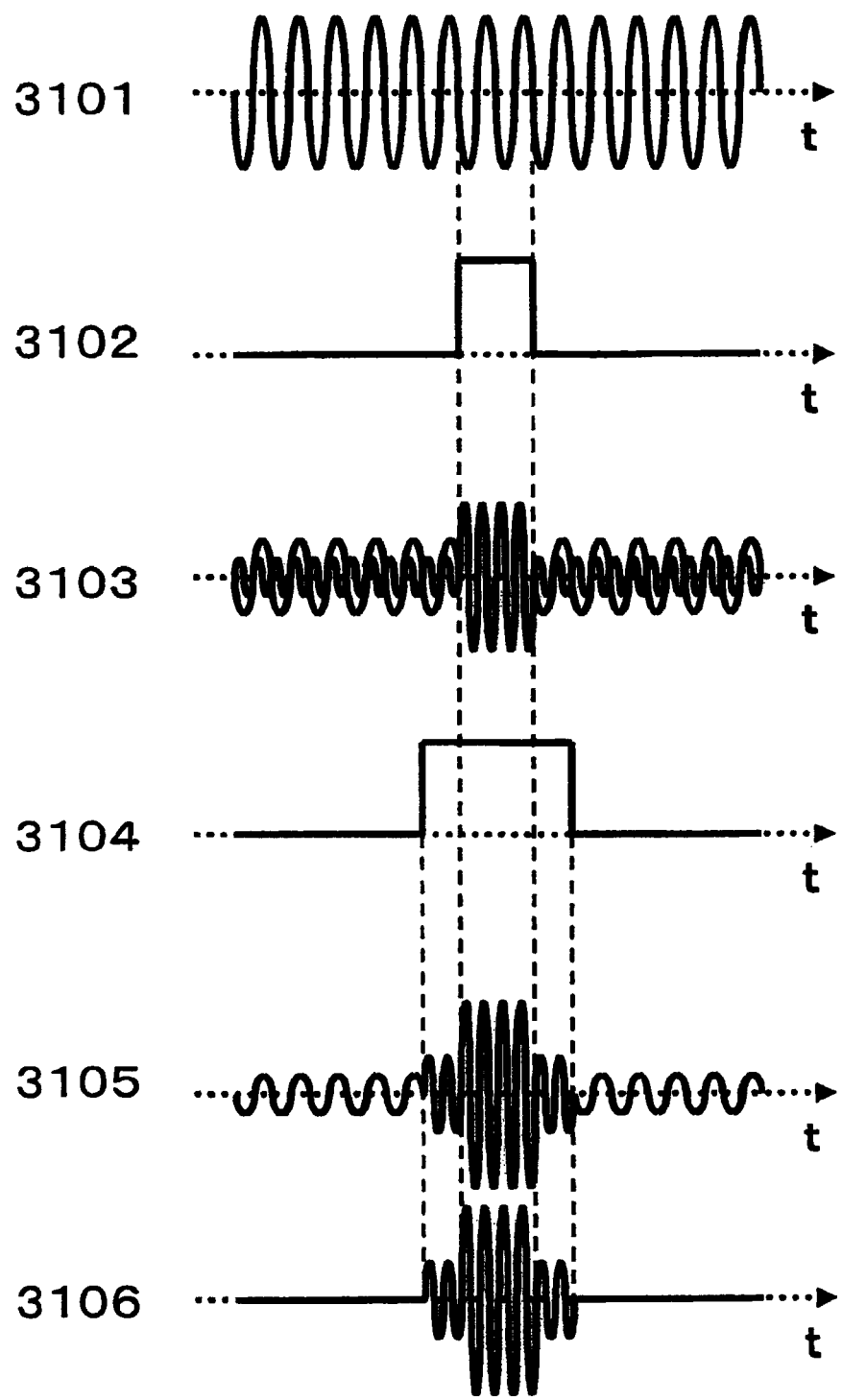
FIG. 33 is a drawing to show a control signal waveform in the related art.
Figure 34:
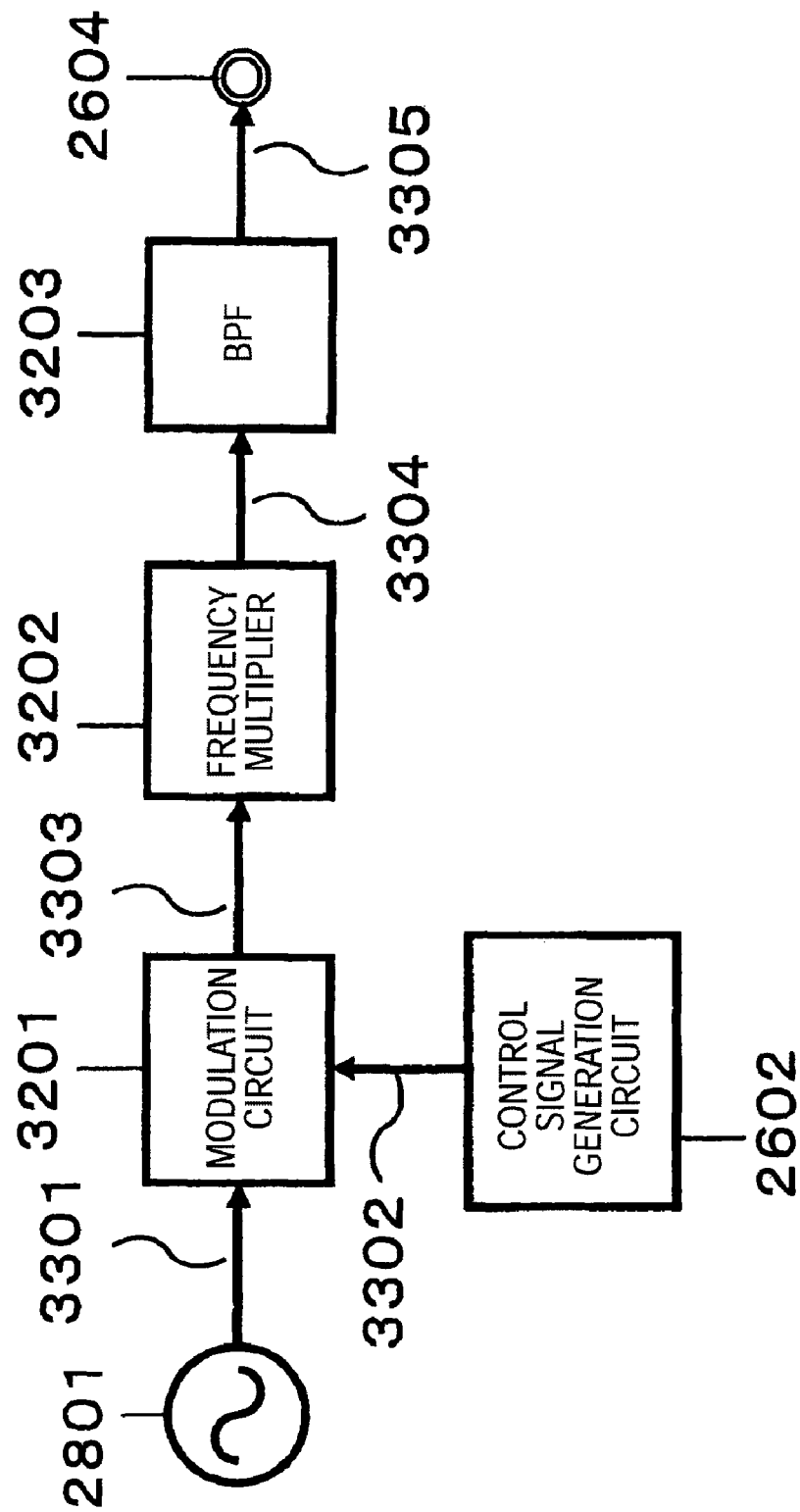
FIG. 34 is a drawing to show the circuit configuration of a short pulse generation circuit of a related art.
Figure 35:
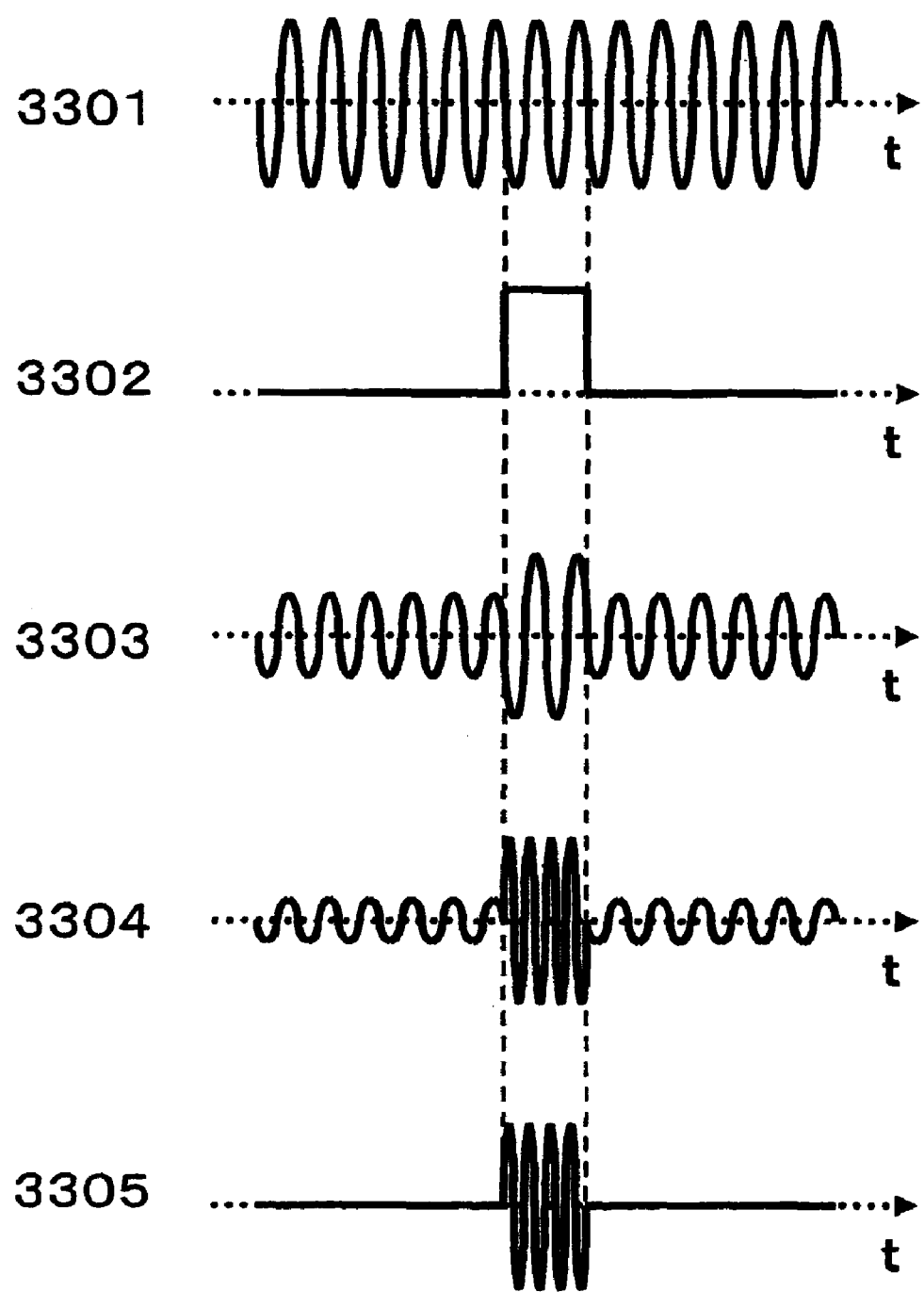
FIG. 35 is a drawing to show a control signal waveform in the related art.

FIG. 27 is a timing chart of control signal waveforms in FIG. 26. Each vertical axis indicates voltage and each horizontal axis indicates the time. One example of an intermittent frequency multiplier 103 will be discussed below with FIGS. 26 and 27:

Although the frequency multiplier of the intermittent frequency multiplier is n (n: Positive integer), in the description to follow, it is assumed that the desired frequency of an output signal is f0, that the frequency of an output signal of an oscillator is f0/2, and that the intermittent frequency multiplier is a doubler circuit, as in the first embodiment.

Like the control signal 202 in FIG. 3, a control signal 3501 controls the intermittent operation of the intermittent frequency multiplier 103. It is assumed that the pulse width of the control signal 3501 is equal to that of the control signal 202 and that the amplitude of the control signal 3501 is equal to or smaller than that of the control signal 202. The operation of the intermittent frequency multiplier 103 is described above and therefore will not be discussed again.

A control signal 3502 is input to the matching circuit 3402. Although the pulse width of the control signal 3502 may be wider than that of the control signal 3501, but it is desirable that the pulse width of the control signal 3502 should be equal to that of the control signal 3501. The matching circuit 3402 has a variable impedance part whose impedance can be controlled by a control signal; for example, it is implemented as a varactor, etc. The control signal 3502 is 0 V at a high voltage level and controls the variable impedance part of the matching circuit 3402 at a low voltage level. The low voltage level of the control signal 3502 is determined by the designed frequency; it is from −200 mV to −2 V if the frequency is from a microwave band to a millimeter wave. A method of controlling the impedance using a varactor, etc., is a known technology and therefore will not be discussed again.

The control signal 3502 is input to the matching circuit 3402 at the timing at which the time during which the intermittent frequency multiplier 103 operates according to the control signal 3501 is contained in the time during which the matching circuit 3402 operates according to the control signal 3502, whereby the matching circuit in an Off period can be controlled. At this time, it is controlled so as to be further out of the matching state (brought away from the center on a Smith chart) in the Off period, whereby the signal level in the Off period of a continuous signal input to a gate terminal of an active element 301 is attenuated and when a high On/Off ratio is realized, the amplitude of the control signal 3501 can also be lessened. Accordingly, power consumption of a baseband circuit for generating the control signal can be decreased.

As described above, the impedance of the matching circuit is also controlled with the intermittent operation of the intermittent frequency multiplier 103 using the control signal, so that a high On/Off ratio can be realized by the control signal of small amplitude.

In the description given above, the matching circuit 3402 operates according to the low voltage signal of the control signal 3502, but an inversion circuit may be inserted between the control signal generation circuit 3401 and a terminal 3405 for controlling the matching circuit 3402 according to the high voltage signal of the control signal input to the matching circuit 3402. At this time, the voltage value at the low voltage level is 0 V.

Although the method of controlling the matching circuit 3402 on the input side has been described, the matching circuit 3403 on the output side may be controlled.

Although the method of controlling the matching circuit 3402 on the input side has been described, the matching circuit 3402 on the input side and the matching circuit 3403 on the output side may be controlled together.

In the description given above, one control signal generation circuit 3401 outputs the control signals 3501 and 3502, but the control signals may be output separately from two or more control signal generation circuits.

In the description given above, the oscillation frequency of the oscillator 101 is a half the frequency of the output signal and the intermittent frequency multiplier 103 is a doubler circuit; however, the oscillation frequency of the oscillator 101 may be 1/n of the frequency of the output signal and the intermittent frequency multiplier 103 may be a multiplying-by-n circuit where n is a positive integer.

In the description given above, the control signal waveform is a pulse, but is not limited to a pulse and may be a sine wave, a cosine wave, or an associated wave thereof.

In the description given above, it is assumed that the output signal is a short pulse as a very short signal having a pulse width of several hundred picoseconds to nanoseconds, but the invention can also be applied to a long signal having a pulse width of microseconds to milliseconds in a similar manner.

In the description given above, FET is adopted as an active element, but it may be a transistor. In this case, a gate corresponds to a base, a drain corresponds to a collector, and a source corresponds to an emitter.

While the embodiments of the invention have been described with reference to the accompanying drawings, the specific configurations are limited to the embodiments and design change, etc., without departing from the gist of the invention is also contained.

While the embodiments of the invention have been described with the accompanying drawings, the invention can also be embodied as a semiconductor integrated circuit and a system operating in a similar manner.

While the invention has been described in detail with reference to the specific embodiments, it will be obvious to those skilled in the art that various changes and modifications can be made without departing from the spirit and the scope of the invention.

This application is based on Japanese Patent Application (No. 2006-178026) filed on Jun. 28, 2006, and Japanese Patent Application (No. 2006-343269) filed on Dec. 20, 2006, the contents of which are incorporated herein by reference.

INDUSTRIAL APPLICABILITY

The pulse generation circuit of the invention intermittently controls conversion gain by controlling the operation point of the intermittent frequency multiplier according to the voltage value of the control signal and can suppress a spurious component if a filter is provided at the following stage and can provide a short pulse signal having a high On/Off ratio as lower power consumption operation and can be used as a pulse generation circuit, a modulator, etc., in high-speed wireless communications.

The invention claimed is:

1. A pulse generation circuit for generating a pulse signal based on first and second continuous signals output from a differential oscillator, the pulse generation circuit comprising:
  a control signal generation circuit for outputting a first control signal containing an On period and an Off period which differs from the On period in voltage value on a time axis;
  a first three-terminal active element having a first active terminal and a second active terminal, in which the first control signal and the first continuous signal are input into the first active terminal, the first continuous signal is frequency-multiplied in accordance with the voltage value of the first control signal, and a first multiplication signal having a conversion gain in the On period of the first control signal higher than a conversion gain in the Off period is output from the second active terminal;
  a second three-terminal active element having a third active terminal and a fourth active terminal, in which the first control signal and the second continuous signal are input into the third active terminal, the second continuous signal is frequency-multiplied in accordance with the voltage value of the first control signal, and a second multiplication signal having a conversion gain in the On period of the first control signal higher than a conversion gain in the Off period is output from the fourth active terminal; and
  a waveform combining circuit for combining the first and second multiplication signals,
  wherein an amplitude of the first control signal in the Off period of the first control signal is larger than an amplitude of the first continuous signal measured at the first active terminal and an amplitude of the second continuous signal measured at the third active terminal.

2. The pulse generation circuit as claimed in claim 1, further comprising a phase shifter for performing a phase shift of at least either of the first and second multiplication signals and supplying the phase-shifted signal to the waveform combining circuit.

* * * * *